United States Patent
Jiang et al.

(10) Patent No.: US 11,646,703 B2
(45) Date of Patent: May 9, 2023

(54) WIDEBAND AUXILIARY INPUT FOR LOW NOISE AMPLIFIERS

(71) Applicant: pSemi Corporation, San Diego, CA (US)

(72) Inventors: Rong Jiang, San Diego, CA (US); Khushali Shah, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 263 days.

(21) Appl. No.: 17/189,062

(22) Filed: Mar. 1, 2021

(65) Prior Publication Data

US 2022/0278656 A1  Sep. 1, 2022

(51) Int. Cl.

| | |
|---|---|
| H03F 1/32 | (2006.01) |
| H03F 3/195 | (2006.01) |
| H03F 1/22 | (2006.01) |
| H03F 3/72 | (2006.01) |
| H03F 1/26 | (2006.01) |
| H04B 1/16 | (2006.01) |
| H03F 1/56 | (2006.01) |

(52) U.S. Cl.
CPC ............. *H03F 3/195* (2013.01); *H03F 1/223* (2013.01); *H03F 1/26* (2013.01); *H03F 1/565* (2013.01); *H03F 3/72* (2013.01); *H04B 1/16* (2013.01); *H03F 2200/294* (2013.01); *H03F 2200/318* (2013.01); *H03F 2200/451* (2013.01)

(58) Field of Classification Search
CPC ................. H03F 1/32; H03F 1/12; H03F 1/07
USPC ............................. 330/126, 295, 51, 124 R
See application file for complete search history.

(56) References Cited

U.S. PATENT DOCUMENTS

| | | | |
|---|---|---|---|
| 6,225,865 B1 * | 5/2001 | Muterspaugh | H01Q 21/30 330/51 |
| 8,710,927 B2 * | 4/2014 | Kamitani | H03F 3/245 330/51 |
| 8,749,305 B2 * | 6/2014 | Retz | H03F 1/0277 330/51 |
| 10,199,996 B2 | 2/2019 | Ayranci et al. | |
| 2006/0189286 A1 * | 8/2006 | Kyu | H03F 3/19 455/132 |
| 2022/0077827 A1 | 3/2022 | Jiang et al. | |

* cited by examiner

*Primary Examiner* — Henry Choe
(74) *Attorney, Agent, or Firm* — Steinfl + Bruno LLP

(57) ABSTRACT

Methods and devices to implement efficiently an AUX terminal in RF front end receivers using LNAs are described. The described methods implement a smaller number of switches resulting in an overall performance improvement by reducing the noise figure at the input of the LNA. The presented devices can be used in low/high gain and bypass modes and can accommodate an arbitrary number of bands over a wide frequency range.

28 Claims, 20 Drawing Sheets

| n75 | B40 | B41 |
|---|---|---|
| 1432 - 1517 MHz | 2300 - 2400 MHz | 2496 - 2690 MHz |

WIDEBAND AUXILIARY INPUT FOR LOW NOISE AMPLIFIERS

CROSS-REFERENCE

The present application may be related to U.S. Pat. No. 10,199,996 issued on Feb. 5, 2019, and to U.S. patent application Ser. No. 17/017,456 filed on Sep. 10, 2020, both of which are incorporated herein by reference in their entirety.

FIELD

The present disclosure is related to radio frequency (RF) circuits including low noise amplifiers (LNA), more in particular to front-end modules of communication devices including LNAs with auxiliary (AUX) ports covering several bands within a wide frequency range.

BACKGROUND

Generally, RF receiver front ends of communication devices are required to cover several bands over a wide frequency range, while having a targeted overall performance. FIG. 1 shows a prior art table (100) summarizing exemplary 3GPP defined frequency bands (n75, B40, B41) along with their respective coverages. The overall targeted receiver performance is usually specified based on performance parameters such as noise figure (NF), gain flatness, input/output matching, power consumption, die area, etc. It is known in the art of RF design that achieving a desired performance by meeting often conflicting requirements for such performance parameters is often a challenge, particularly over a wide band.

With continued reference to FIG. 1, and in view of the above-mentioned design challenges, receiver front end architectures using multiple LNAs have been proposed. In such architectures, each frequency band is assigned to a separate narrow-band LNA and its associated circuitry. The goal is to confine the bandwidth requirements of each separate LNA to make the overall design possible given the narrower individual bandwidth requirements for each respective LNA.

In some applications, regardless of the receiver front-end architecture, it is highly desirable to have an AUX input that is not designated for use by any particular frequency band. In other words, the AUX input is required to cover several bands within a wide frequency range while meeting the same overall targeted performance of the receiver front end. This will provide a highly desired flexibility by allowing the same communication module to be reconfigured in several geographic regions and to be useful with future revisions. This would be achieved by a single input available to the user in contrast with having to use separate inputs dedicated to separate bands which would have to be implemented using input switching.

FIG. 2 shows a prior art RF receiver front end (200) having a multiple-input LNA architecture. RF receiver front end (200) includes input terminals (in1, in2, in3) each dedicated to a separate frequency band. The RF receiver front end (200) further includes amplifying transistors (T1, . . . , T3) each arranged in a common source configuration and coupled to cascode transistor (T0) implemented in a common gate configuration. RF receive front end (200) also comprises inductors (L1, . . . , L3), DC blocking capacitors (C1, . . . , C3) and filters (F1, . . . , F3). A combination of each transistor (T1, . . . , T3) with its associated circuitry represents essentially a separate narrow band LNA designed to accommodate a corresponding band. For example, a combination of amplifying transistor (T1), with inductor (L1), capacitor (C1) and filter (F1) is designed to optimally accommodate and amplify a first received signal within a first frequency band. As a further example, a combination of amplifying transistor (T2), with inductor (L2), capacitor (C2) and filter (F2) is designed to optimally accommodate and amplify a second received signal within a second frequency band. RF front end receiver (200) further includes inductor (Ld1) coupling cascode transistor (T0) to supply voltage (Vdd) and a degenerative inductor (Ld2) coupling the amplifying transistors to a reference voltage which, for example, can be ground as shown in FIG. 2. During operative conditions, the amplified signal is provided at output terminal (OUT).

RF receiver front end (200) of FIG. 2 further includes an AUX terminal with dedicated inductor (L4), capacitor (C4) and amplifying transistor (T4). As the AUX terminal is required to be wide band, no dedicated input filter is implemented at the input. However, given that the AUX terminal path includes only a single dedicated inductor (L4), and in view of what was described above, the AUX terminal as shown may not be able to accommodate wider bands (e.g. 400 MHz and above) while meeting an overall desired performance over such wider bands.

In view of the above, there is a need for RF receiver front ends having AUX inputs that can receive inputs in several frequency bands over a broad frequency range. At the same time, the AUX input path is required to meet the above-mentioned stringent and often conflicting specifications defined based on an overall desired performance of the RF receiver.

SUMMARY

The disclosed methods and devices provide practical solutions to the above-mentioned design challenges.

According to a first aspect of the disclosure, a multiband radio frequency (RF) receiver front end is provided, comprising: a plurality of amplifying transistors; a switching block comprising a plurality of switching arrangements, each switching arrangement being in correspondence with a selectable frequency band of a plurality of selectable frequency bands and with an amplifying transistor of the plurality of amplifying transistors; one or more impedance matching inductors, each impedance matching inductor coupling a respective switching arrangement to a respective amplifying transistor, each being matched to a respective selectable RF band, and an auxiliary (AUX) terminal configured to receive a wideband input signal, the AUX terminal being connected to the plurality of amplifying transistors via the switching block.

According to a second aspect of the disclosure, a multi-band radio frequency (RF) receiver front end is provided, comprising: a low noise amplifier (LNA) having with an LNA input and an LNA output; an RF receiver output terminal; a plurality of main input terminals in correspondence with a plurality of selectable frequency bands; each main input terminal configured to receive a corresponding main input signal of a plurality of main input signals; an auxiliary (AUX) terminal being configured to receive a wideband input signal; a first switching arrangement coupled between the LNA input and the plurality of main input terminals; a second switching arrangement coupled between the AUX terminal and the first switching arrangement; a third switching arrangement coupled to the first switching arrangement, and an attenuator coupling the AUX terminal and the second switching arrangement to the third switching arrangement; wherein, in a first state: the first switching arrangement is configured to decouple the plurality of main input terminals from the LNA input; the second switching arrangement is configured to decouple the plurality of main input terminals from the AUX terminal; based on a selected band of the plurality of selectable frequency band, a combination of the first switching arrangement and the third switching arrangement is configured to convey the wideband signal from the AUX terminal, through the attenuator, to the LNA input.

According to a third aspect of the disclosure, an amplification method in a multiband radio frequency (RF) receiver front end is disclosed, comprising: providing an LNA with an LNA input terminal; providing a plurality of main input terminals; providing an auxiliary (AUX) terminal; providing an attenuator; in a first state: applying a wideband signal at the AUX terminal; decoupling the main input terminals from the LNA input terminal; decoupling the main input terminals from the AUX terminal; based on a selected frequency band of a plurality of selectable frequency bands, routing the wideband signal through the attenuator to the LNA input terminal, and generating a first state amplified signal by the LNA.

Further aspects of the disclosure are provided in the description, drawings and claims of the present application.

DESCRIPTION OF THE DRAWINGS

FIG. 1 shows a prior art table summarizing exemplary frequency bands.

DETAILED DESCRIPTION

Throughout the present detailed description, the term "wideband" is used to refer to the frequency bands with bandwidths of greater 10% of the band's center frequency. For example, if the center frequency is 2 GHz, frequency bands greater than 200 MHz are considered wideband. As a further example, if the center frequency is 4 GHz, frequency bands greater than 400 MHz are considered wideband.

Figure 2:
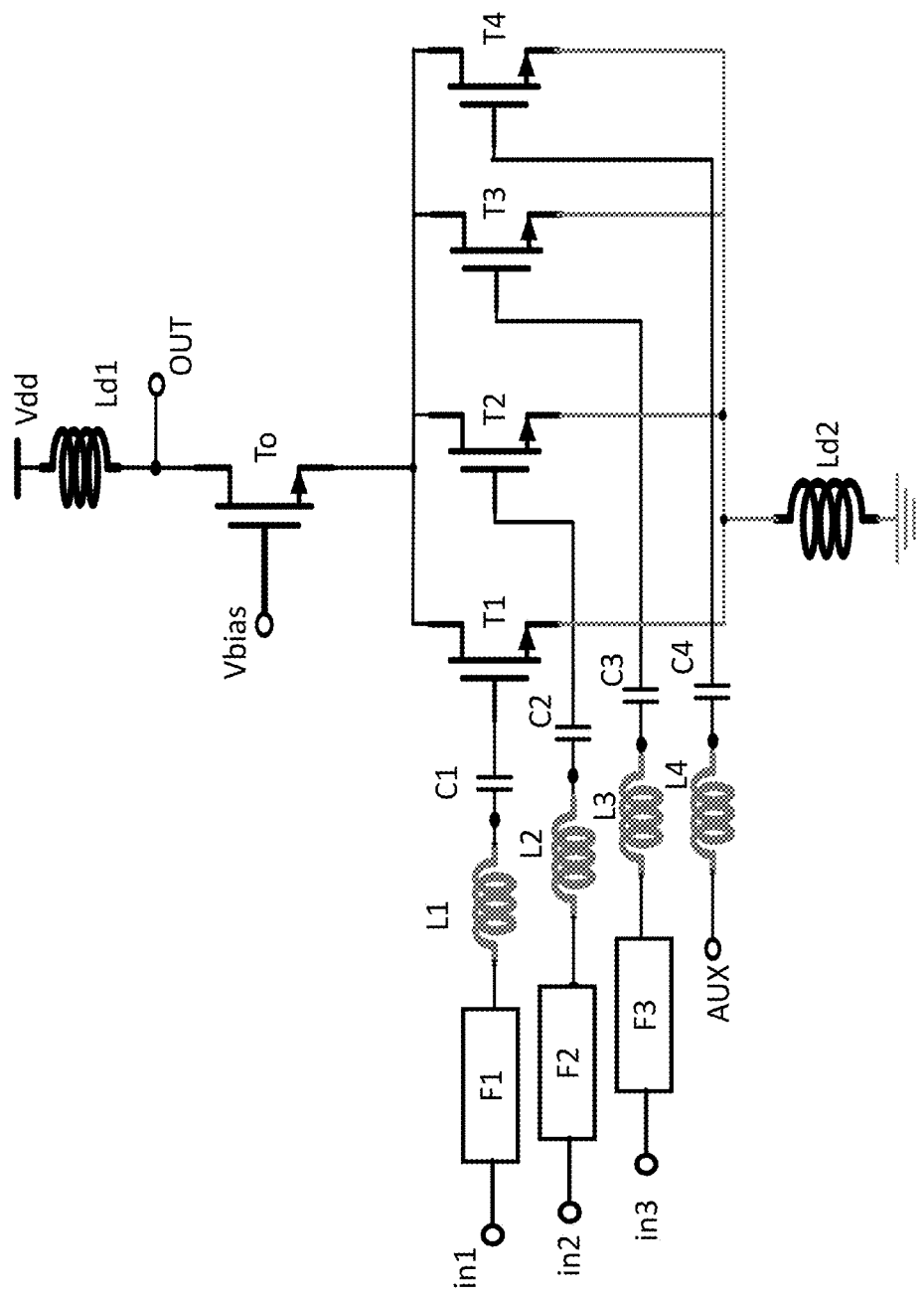
FIG. 2 shows a prior art single LNA using multiple inputs.
Figure 3:
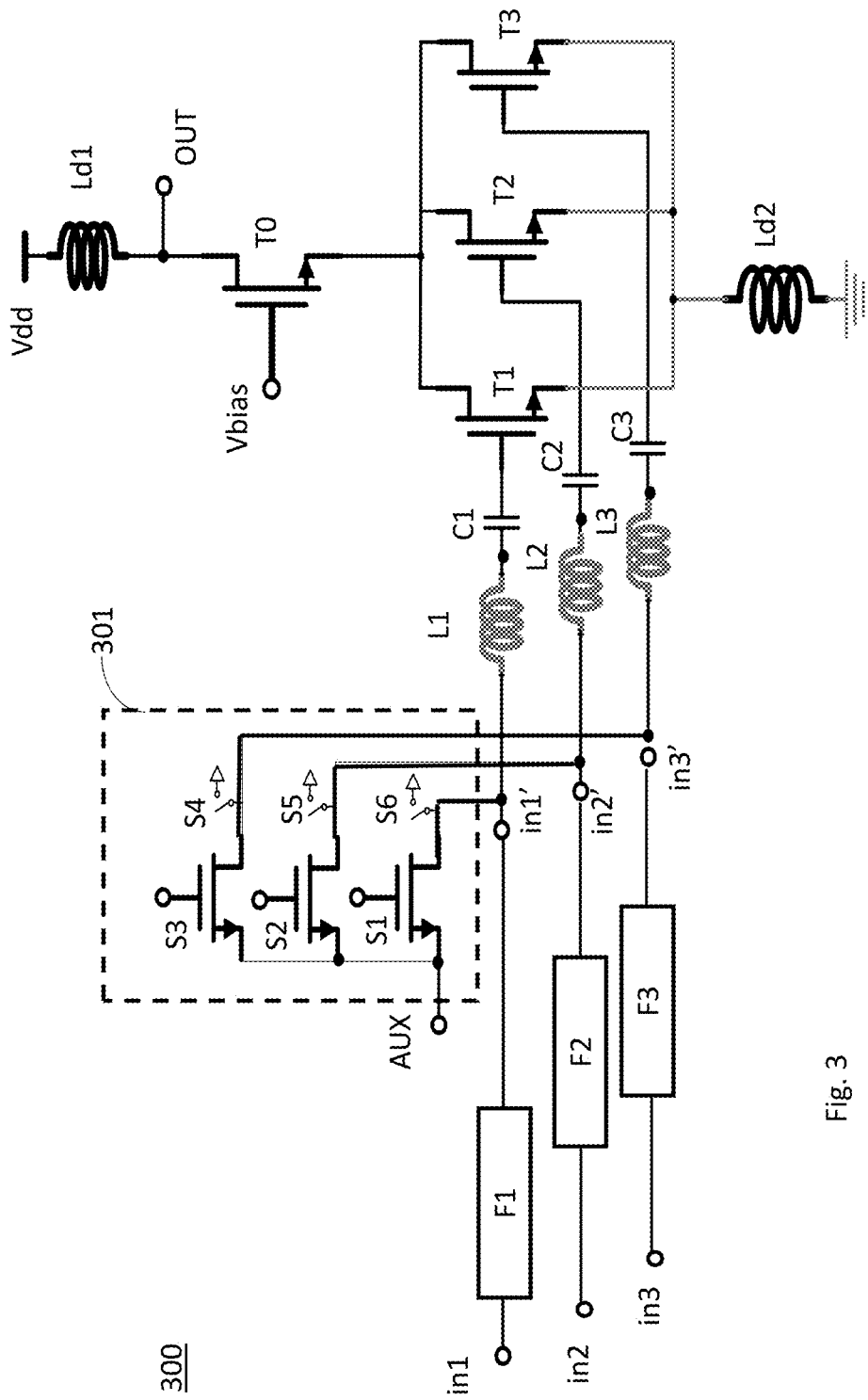
FIG. 3 shows an exemplary RF receiver front end according to an embodiment of the present disclosure.

FIG. 3 shows an exemplary RF receiver front end (300) according to an embodiment of the present disclosure. The principle of operation of the RF receiver front end (300) is similar to what was described with regards to RF receiver front end (200) of FIG. 2, except that the AUX terminal is differently implemented. The AUX terminal of RF receiver front end (300) is coupled to terminals (in1', in2', in3') located downstream of respective filters (F1, F2, F3), and via switching block (301). Terminals (in1', in2', in3') are coupled to respective transistors (T1, T2, T3) through corresponding LC elements. Switching block (301) comprises switches (S1, . . . , S6) wherein switches (S1, S2, S3) are series switches, each corresponding to a respective frequency band. When a certain band is selected, the corresponding series switch (e.g. S1) is in ON state (closed) and the other series switches (e.g. S2, S3) are in OFF state (open). As a result, the AUX terminal is coupled to one of the terminals (e.g. in1' in the example above) that corresponds to the selected frequency band. Also shown in FIG. 3 are inductor (Ld1) coupling transistor (T0) to supply voltage (Vdd), and inductor (Ld2) coupling transistors (T1, T2, T3) to ground.

Referring to FIG. 3, and as an example, when a first frequency band is selected, switch (S1) is ON and switches (S2, S3) are OFF, and as a result, the input signal corresponding to the first frequency band is coupled to input (in1') thereby passing through (L1, C1) to reach corresponding transistor (T1). Continuing with the same example, a combination of transistors (T1, T0) will amplify the input signal to generate an output signal at output terminal (OUT). It is understood that while the exemplary embodiment shown in FIG. 3 shows one cascode transistor (T0), further embodiments including two or more cascode transistors may also be envisaged according to the teachings of the present disclosure.

With further reference to FIG. 3, switches (S4, S5, S6) are shunt switches used for further isolation. Such switches are in OFF state (open) when the corresponding frequency band is selected and are in ON state (closed), to provide further isolation when the corresponding band is not selected. According to an embodiment of the present disclosure, a control circuit (not shown for the sake of simplicity) may be implemented to control the states of switches (S1, . . . , S6). For the sake of example, the embodiment of FIG. 3 is shown with three terminals, although embodiments with an arbitrary number of terminals accommodating any number of bands may also be envisaged in accordance with the teachings of the present disclosure.

With continued reference to FIG. 3, the person skilled in the art will appreciate the flexibility offered by implementing the AUX terminal as shown. There is no filter dedicated to the AUX terminal to provide flexibility to adapt to any frequency band depending on the geographical area where the transceiver would be deployed. Moreover, a single terminal is providing access to multiple bands resulting in a simplification of the overall design. As the impedance seen from each of terminals (in1', in2', in3') into respective filters (F1, F2, F3) may not provide the best matching for an optimal design, further improvement may also be made by other embodiments as described next.

Figure 4:
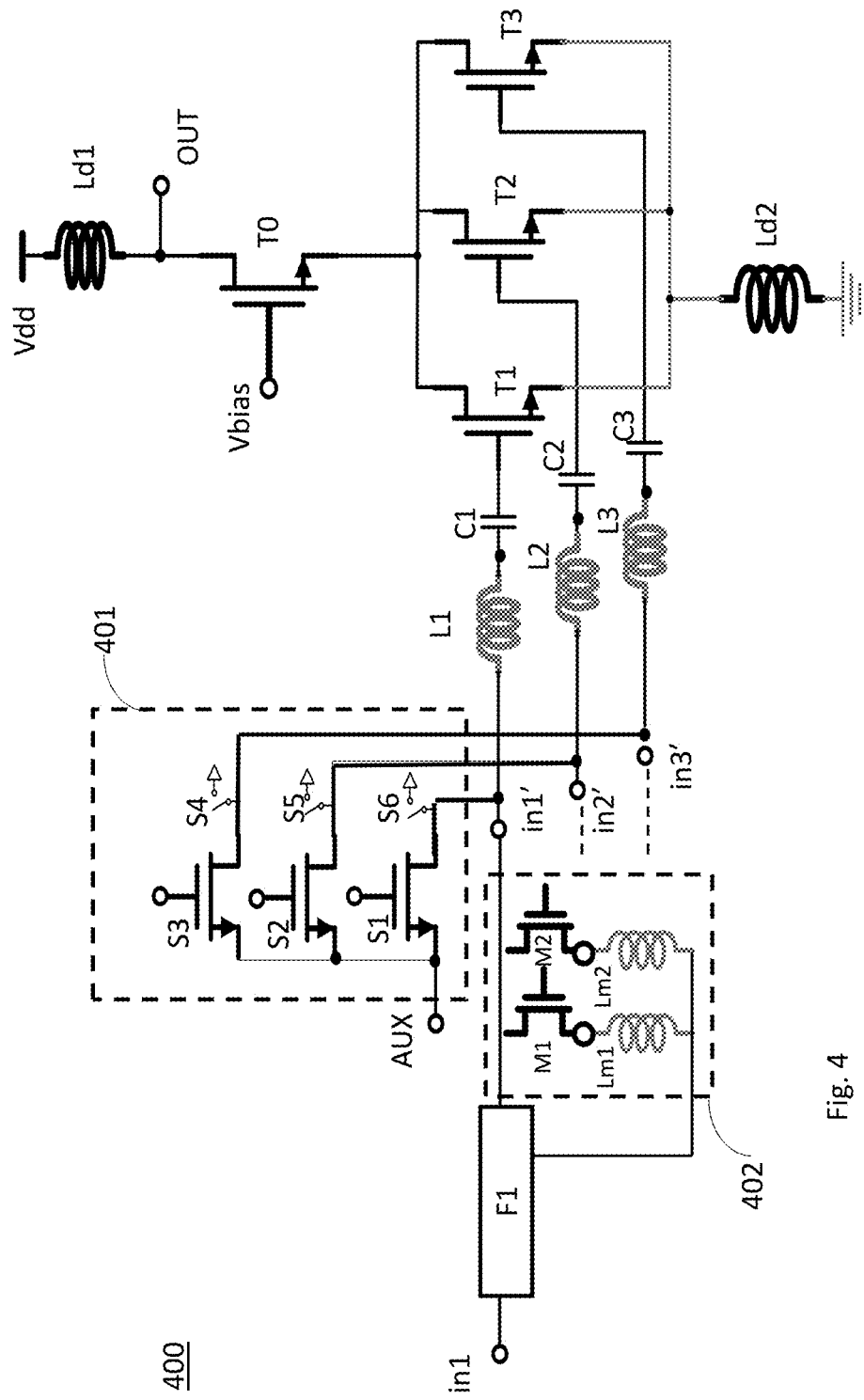
FIG. 4 shows an exemplary RF receiver front end according to an embodiment of the present disclosure.

FIG. 4 shows an exemplary RF receiver front end (400) according to another embodiment of the present disclosure. The principle of operation of RF receiver front end (400) is similar to what was described with regards to RF receiver front end (300) of FIG. 3, except for the addition of impedance matching block (402). For the sake of simplicity and readability, filters (F2, F3) of FIG. 3 are not shown in FIG. 4. Impedance matching block (402) comprises switches (M1, M2) and matching inductors (Lm1, Lm2) each of which is selectively switched in/out during operative conditions. As an example, if input (in1) is used, inductor (Lm1) is switched in by closing switch (M1), while inductor (Lm2) is switched out by opening switch (M2). As a result, optimized matching of filter (F1) is achieved through the use of matching inductor (Lm1). On the other hand, if the AUX terminal is being used, matching inductor (Lm2) is switched in by closing switch (M2), while matching inductor (Lm1) is switched out by opening switch (M1). As a result, improved matching of the AUX terminal looking into filter (F1) is obtained. As mentioned above, for the sake of simplicity and further readability, terminals (in2, in3) of FIG. 3 and associated filters (F2, F3) of the same figure are not shown in FIG. 4, however, according the teaching of the present disclosure, similar matching blocks as impedance matching block (402) may also be implemented downstream of the filters (F2, F3) for the same impedance matching purposes as described above.

Figure 5A:
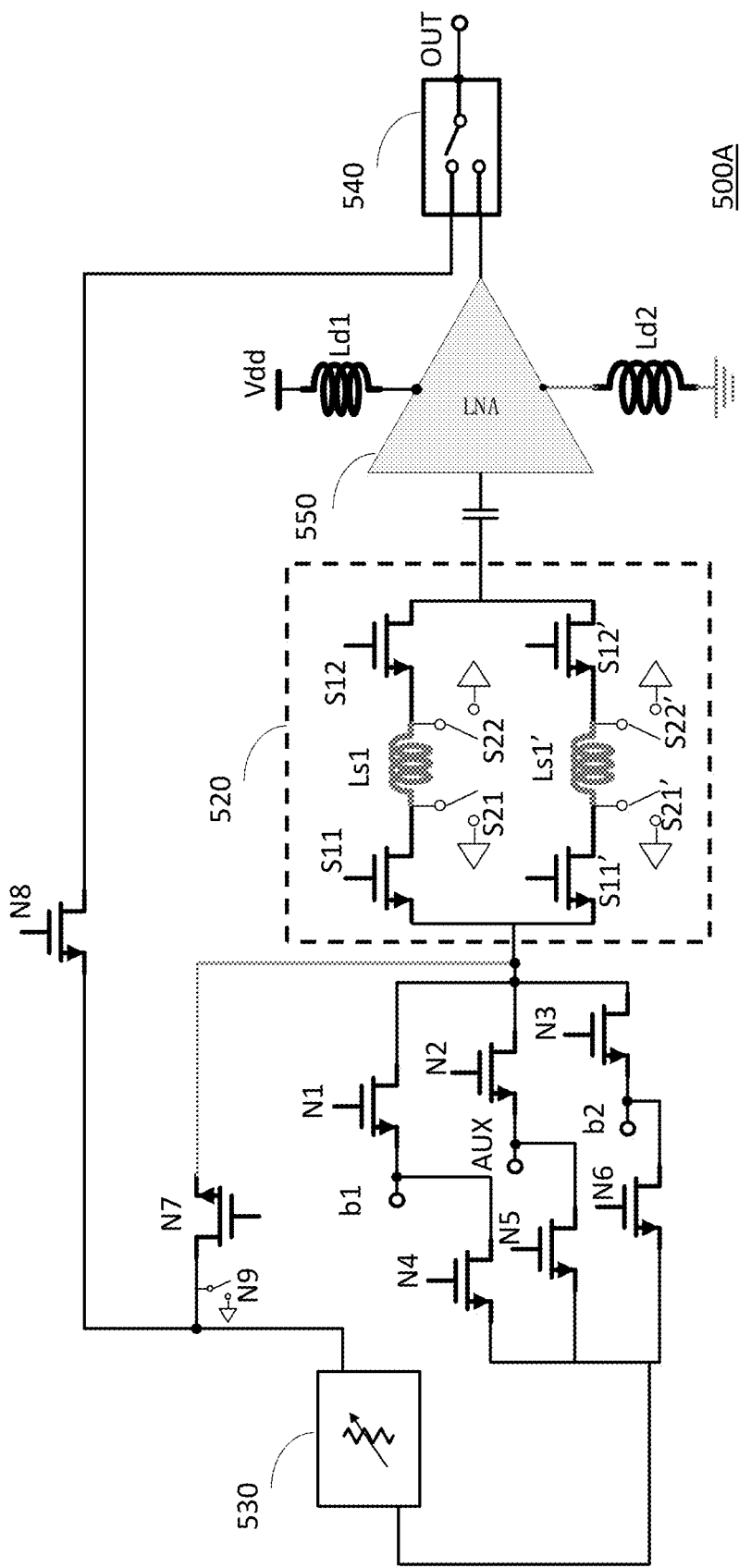
FIG. 5A shows an RF receiver front-end.

FIG. 5A shows an RF receiver front-end (500A) as described in detail in the co-owned and co-pending U.S. patent application Ser. No. 17/017,456 incorporated herein by reference in its entirety. In contrast with the multiple LNA front end architectures previously shown in FIGS. 3-4, RF receiver frond end (500A) has a single LNA (550), and the selection of different frequency bands here is performed via band switching block (520). As shown, band switching block (520) comprises first band selecting switches (S11, S12, S21, S22), inductor (Ls1), second band selecting switches (S11', S12', S21', S22'), and inductor (Ls1'). Switches (S21, S22, S21', S22') are used for further isolation when their corresponding frequency band is not selected.

With further reference to FIG. 5A, RF receiver front end (500A) includes terminals (b1, b2) and an AUX terminal. Terminals (b1, b2) correspond to two separate frequency bands. Inductors (Ls1, Ls1') are designed to match a first or a second selected frequency band respectively. Matching filters may also be implemented upstream of terminals (b1, b2) but such filters are not shown in FIG. 5A for the sake of clarity. The functionality of such filters would be similar to, for example, filter (F1) of FIGS. 3-4. The functionality of the AUX terminal as shown is similar to what was described with regards to the AUX terminal previously shown in FIGS. 3-4.

According to embodiments of the present disclosure, the AUX terminal can cover the frequency bands between the frequency bands corresponding to terminals (b1, b2). As an example, if the selected frequency band is closer to the frequency band corresponding to terminal (b1), then inductor (Ls1) may be reused. On the other hand, if the selected frequency band is closer to the frequency band corresponding to terminal (b2), then inductor (Ls1') may be reused.

RF receiver front end (500A) is configured to operate in a high gain, low gain and bypass modes. In particular, also shown in FIG. 5A are switches (N1, . . . , N8), the status of which defines what gain mode the receiver will operate at. In addition, output switch (540) may route the output signal either from the output of LNA (550) or from a bypass path through switch (N8) to the device output (see more details below). RF front end (500A) further includes attenuator (530) used to further attenuate the signal path in a low gain mode.

To further clarify the various operative conditions of RF receiver front end (500A), in what follows the various signal paths corresponding to different gain modes and separate band selections are described in more detail.

Figure 5B:
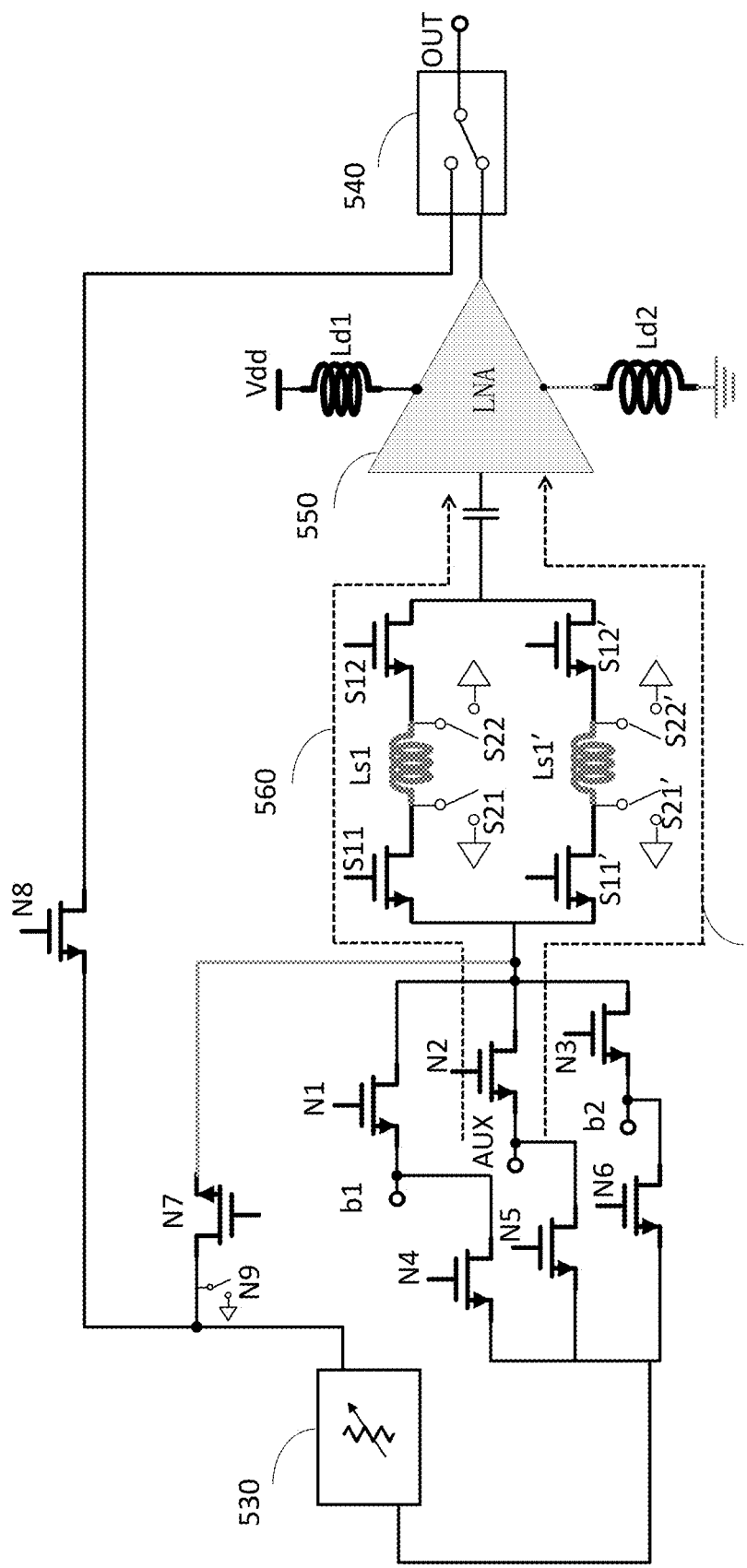
FIGS. 5B-5E show different modes of operation of the RF receiver front end of FIG. 5A.

FIG. 5B shows RF receiver front end (500A) of FIG. 5A where the AUX terminal is being used in high gain mode. The signal paths corresponding to a selected first or second frequency band are schematically and conceptually indicated by dotted lines (560, 561) respectively. In order to describe the status of various switches, the scenario where the first band is selected is considered. Switches (S11, S12) are ON (closed) to pass the signal coming from the AUX terminal to LNA (550) through the path indicated by dotted line (560). Inductor (Ls1) is chosen to provide matching for the first frequency band. Switches (S21, S22) are OFF (open) and switch (540) is in bottom position to transfer the amplified signal generated at the output of LNA (550) to output terminal (OUT). Switches (N1, N3, S11', S12') are OFF (open) to decouple the signals from terminals (b1, b2) from the input of LNA (550). Switches (S21', S22') are ON (closed) to provide added isolation. Switches (N4, . . . , N8) are all OFF (open) to decouple the low gain and bypass path and switch (N9) is ON (closed) to provide further isolation. Attenuator (530) is not being used for the high gain mode.

Figure 5C:
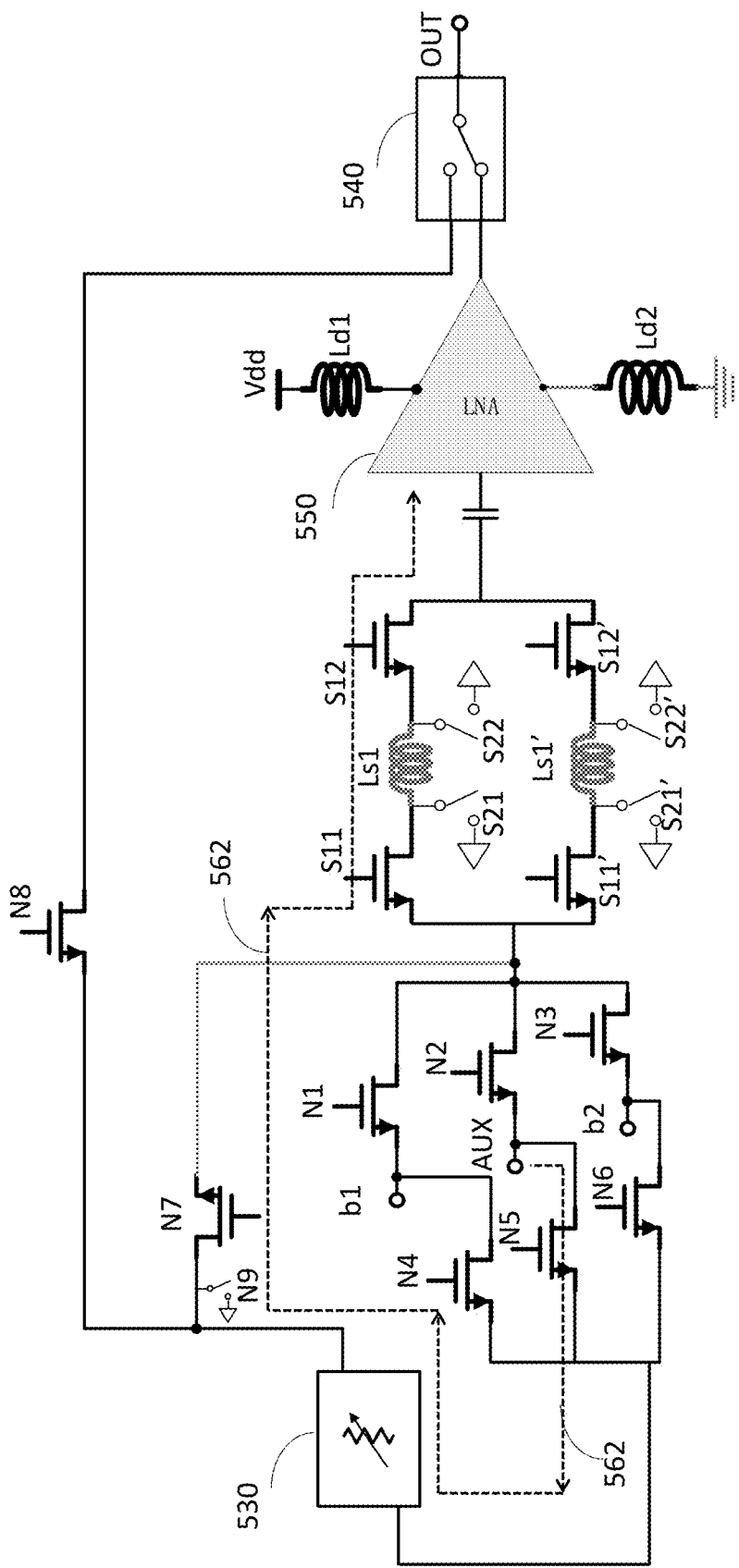

FIG. 5C shows RF receiver front end (500A) of FIG. 5A where the AUX terminal is being used in low gain mode. The signal path corresponding to the scenario where the first frequency band is selected, is indicated by dotted line (562). Switches (S11, S12) are ON (closed) to pass the signal coming from the AUX terminal to LNA (550) through the path indicated by dotted line (562). Inductor (Ls1) is chosen to provide matching for the first frequency band. Switches (S21, S22) are OFF (open) and switch (540) is in bottom position to transfer the amplified signal generated at the output of LNA (550) to output terminal (OUT). Switches (N1, N3, N4, N6) are OFF (open) to decouple terminals (b1, b2) from the rest of the circuit. Switch (N2) is OFF (open) but switches (N5, N7) are ON (closed) to guide the input signal at the AUX terminal and travel it through the low gain mode path indicated by dotted line (562) and via attenuator (530). Switches (N8) is OFF (open) to decouple the bypass path. Switch (N9) is also OFF (open) to prevent the signal to be shorter to ground.

Figure 5D:
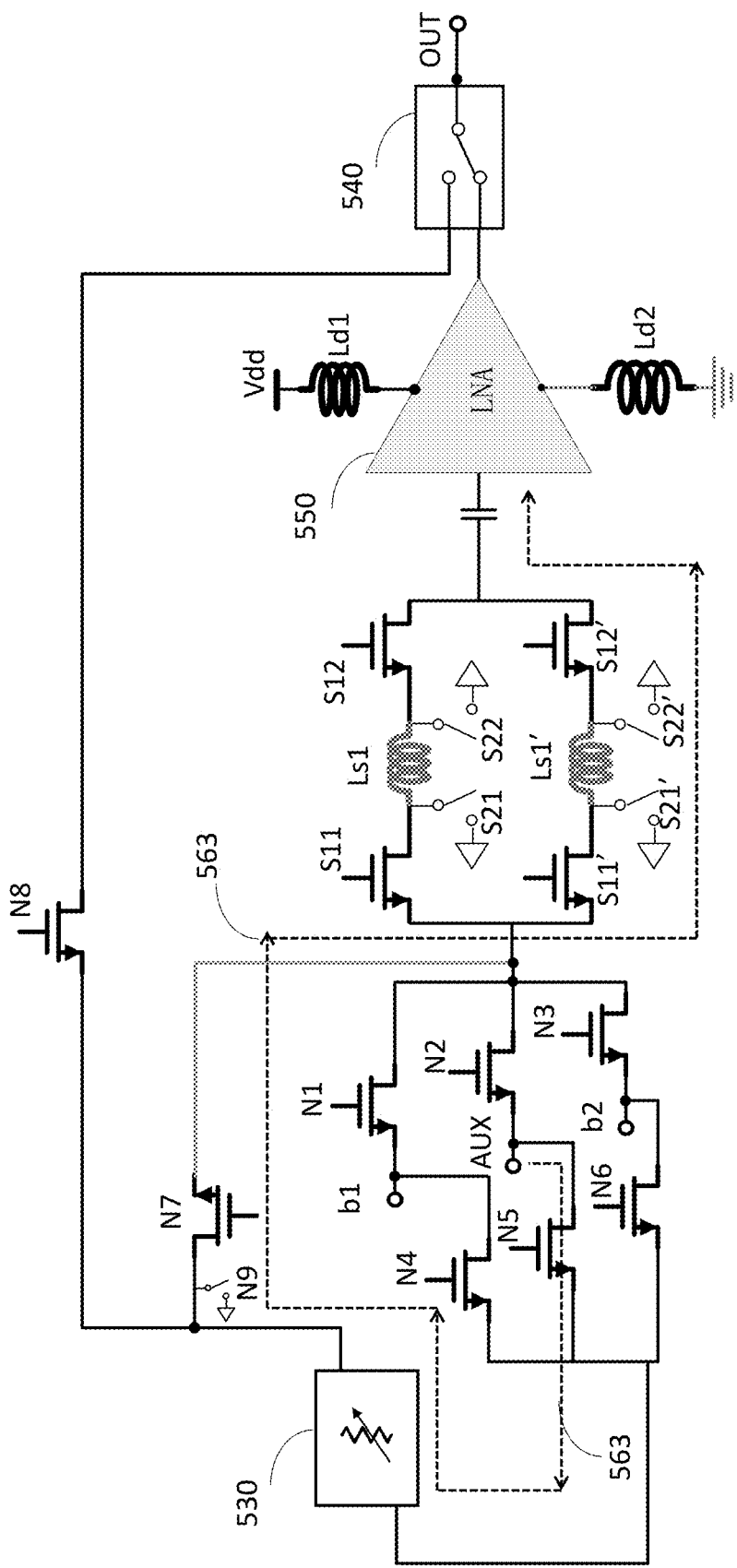

FIG. 5D shows RF receiver front end (500A) of FIG. 5A where the AUX terminal is being used in low gain mode. The signal path corresponding to the scenario where the second frequency band is selected, is indicated by dotted line (563). Switches (S11', S12') are ON (closed) to pass the signal coming from the AUX terminal to LNA (550) through the path indicated by dotted line (563). Inductor (Ls1') is chosen to provide matching for the second frequency band. Switches (S21', S22') are OFF (open) and switch (540) is in bottom position to transfer the amplified signal generated at the output of LNA (550) to output terminal (OUT). Switches (N1, N3, N4, N6) are OFF (open) to decouple terminals (b1, b2) from the rest of the circuit. Switch (N2) is OFF (open) but switches (N5, N7) are ON (closed) to guide the input signal at the AUX terminal to travel through the low gain mode path indicated by dotted line (563) and via attenuator (530). Switch (N8) is OFF (open) to decouple the bypass path. Switch (N9) is also OFF (open) to prevent signal to be shorted to ground.

Figure 5E:
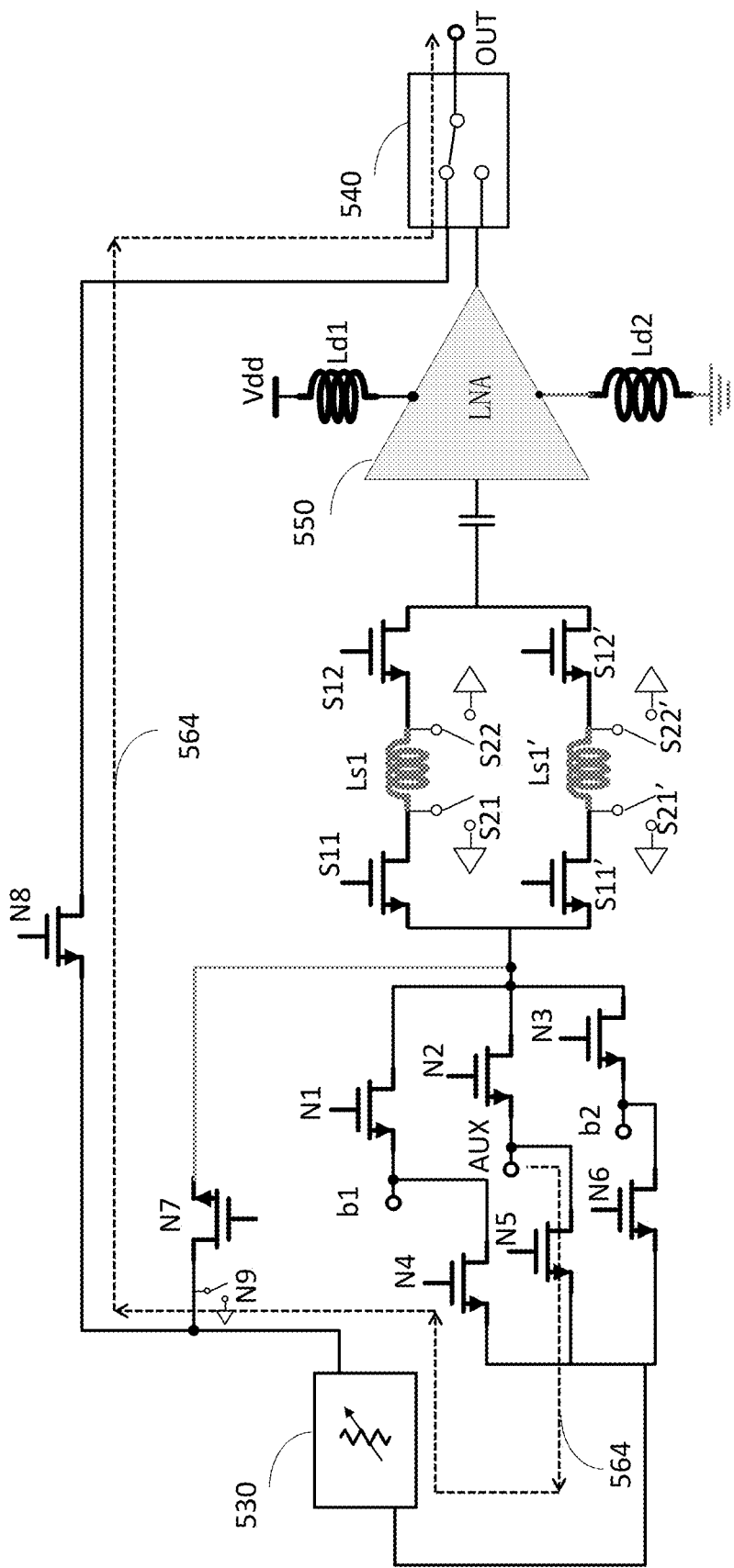

FIG. 5E shows RF receiver front end (500A) of FIG. 5A where the AUX terminal is being used in bypass mode. The signal path for the bypass mode is shown with the dotted line (564). Switch (540) is in top position to route the signal coming through switch (N8) to output terminal (OUT). Switches (N1, N3, N4, N6) are OFF (open) to decouple terminals (b1, b2) from the rest of the circuit. Switches (N2, N7, S11, S12, S11', S12') are OFF (open) for further isolation. Switches (N5, N8) are ON (closed) to guide the signal coming from the AUX terminal to output terminal (OUT). Switch (N9) is open and attenuator (530) may be set based on the desired attenuation in the bypass mode. Such attenuator may also be bypassed in this mode.

With reference to FIGS. 5A-5E attenuator (530) may be tunable or may comprise one or more attenuation elements that are selectively switchable. Control circuits (not shown) may be implemented to control the statues of various switches shown in FIGS. 5A-5E.

With further reference to FIGS. 5A-5E, it can be noticed that there are a certain number of switches in the signal path for the main bands (e.g. the first and the second frequency bands corresponding to terminals (b1, b2) before reaching LNA (550). Reducing the number of such switches will improve the noise figure (NF) and therefore the overall performance of the presented RF receiver front end. In what follows, embodiments in accordance with the teachings of the disclosure and offering such improvement will be described in detail.

Figure 6A:
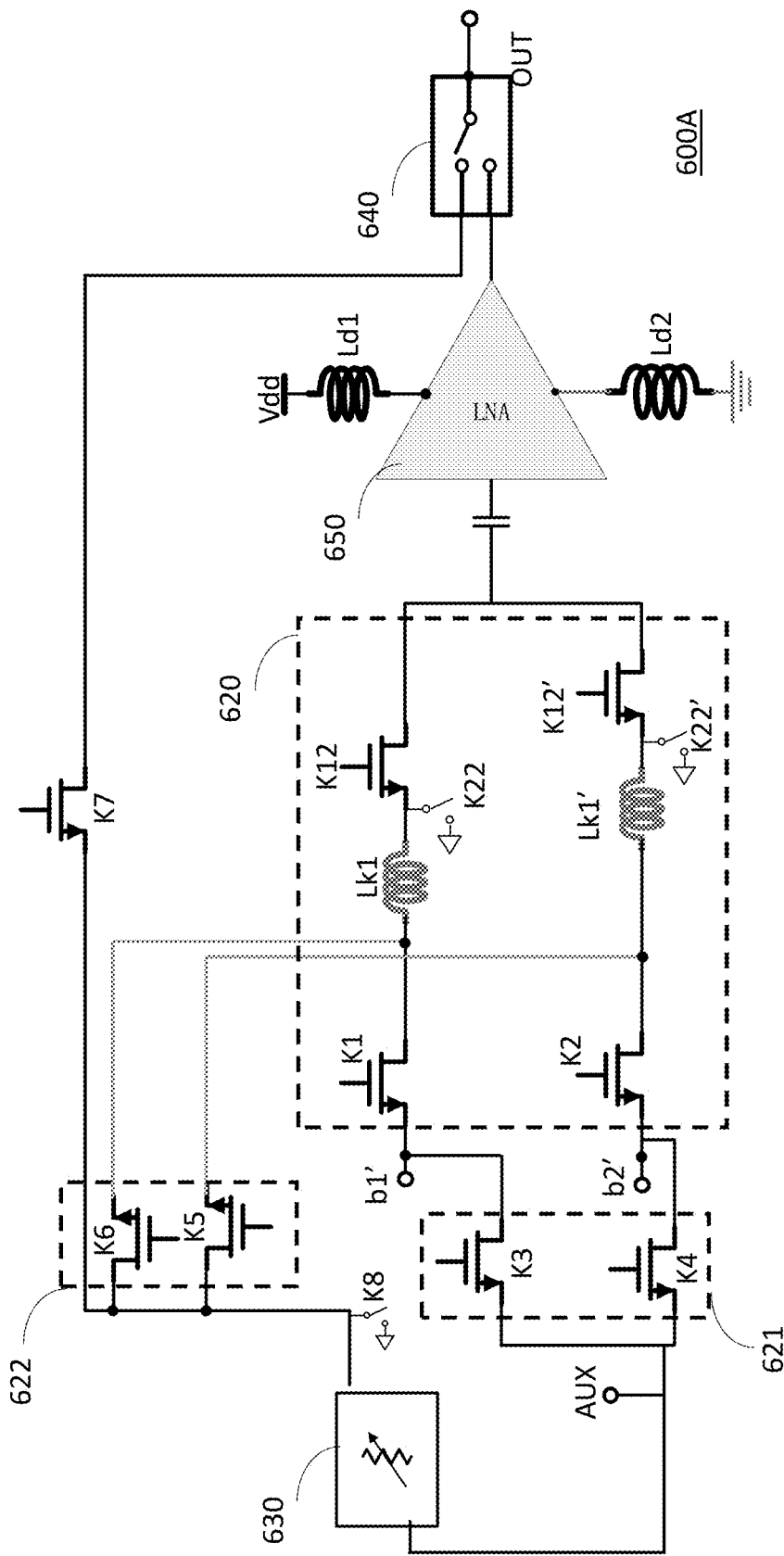
FIG. 6A shows an exemplary RF receiver front end according to an embodiment of the present disclosure.

FIG. 6A shows an exemplary RF receiver front end (600A) according to an embodiment of the present disclosure. RF receiver frond end (600A) comprises LNA (650), first switching arrangement (620), second switching arrangement (621) and third switching arrangement (622). First switching arrangement (612) comprises switches (K1, K12, K2, K12', K22, K22') and inductors (Lk1, Lk1'). Second switching arrangement (621) comprises switches (K3, K4) and third switching arrangement (622) comprises switches (K5, K6). As it will be seen more in detail through the exemplary embodiments of FIGS. 6B-6J, the status of the first, second and third switching arrangements (620, 621, 622) will control the different gain modes of RF receiver front end (600A).

With reference to FIG. 6A, Switches (K22, K22') are used for further isolation when their corresponding frequency band is not selected. Also shown are inductors (Ld1, Ld2) coupling LNA (650) to supply voltage (Vdd) and ground respectively. In accordance with the teachings of the present disclosure, inductors (Ld1, Ld2) may be replaced by a tunable matching network for output matching purpose and can may be tuned when frequency band is switched).

RF receiver front end (600A) of FIG. 6A further includes terminals (b1', b2') and an AUX terminal. Terminals (b1', b2') correspond to two separate frequency bands. Inductors (Lk1, Lk1') are designed to match a first or a second selected frequency band respectively, or to match any frequency bands close to those two bands or in between without or with additional tuning components (e.g. additional input shunt-to-ground inductor or Gate-to-Source capacitor Ggs of LNA input device), when AUX terminal is being used. Matching filters may also be implemented upstream of terminals (b1', b2'). Such filters are not shown in FIG. 6A for the sake of clarity. The functionality of such filters is similar to, for example, filter (F1) of FIGS. 3-4. The functionality of the AUX terminal as shown is similar to what was described with regards to the AUX terminal previously shown in FIGS. 3-4. RF receiver front end (600A) is configured to be implemented in a high gain, low gain and bypass mode. In addition, output switch (640) will route the output signal either from the output of LNA (650) or from the bypass path through switch (K7) to the device output (see more details below).

RF front end (600A) of FIG. 6A further comprises attenuator (630) used to further attenuate the signal path in a low gain mode. Attenuator (630) may be implemented as tunable, or it may comprise one or more attenuation elements that may be selectively switched in to set a desired attenuation. In what follows, in order further clarify various operative conditions of RF receiver front end (600A), various signal paths corresponding to different gain modes and separate band selections are described in more detail.

Comparing RF front end receiver (600A) of FIG. 6A with RF front end receiver (500A) of FIG. 5A, it is appreciated that RF front end receiver (600A) includes a lower number of switches (series and shunt) in the path of the main frequency bands, and as mentioned previously, this will result in an improved NF (e.g. 0.1 dB or more). As an example, the signal path from terminal (b1') to LNA (650) of FIG. 6A includes switches (K1, K12), in series configuration, and switch (K22), in shunt configuration. This is in contrast with the case of FIG. 5A, where for the similar path, switches (N1, S11, S12), in series configuration, and switches (S21, S22), in shunt configuration, have been implemented. This will result in an improved NF and overall performance in the signal path of the main bands. In order to achieve this, comparing the embodiments of FIGS. 5A and 6A, it is noticed that terminals (b1', b2') are more downstream and closer to switching arrangement (620) compared to their counterpart terminal (b1, b2). Also, switches (N1, N3) of FIG. 5A are omitted in the embodiment of FIG. 6A and the AUX terminal is connected to switches (K3, K4) differently from the AUX terminal of FIG. 5A that is connected to switch (N2). As also will be described later, the signal path for the AUX terminal of FIG. 6A will be through attenuator (630). This may result in a slight degradation of NF for the AUX terminal, but it is acceptable given a generally more relaxed requirement for the AUX terminals compared to the main bands. FIGS. 6B-6F presented below will further clarify the above-mentioned alternative embodiment.

Figure 6B:
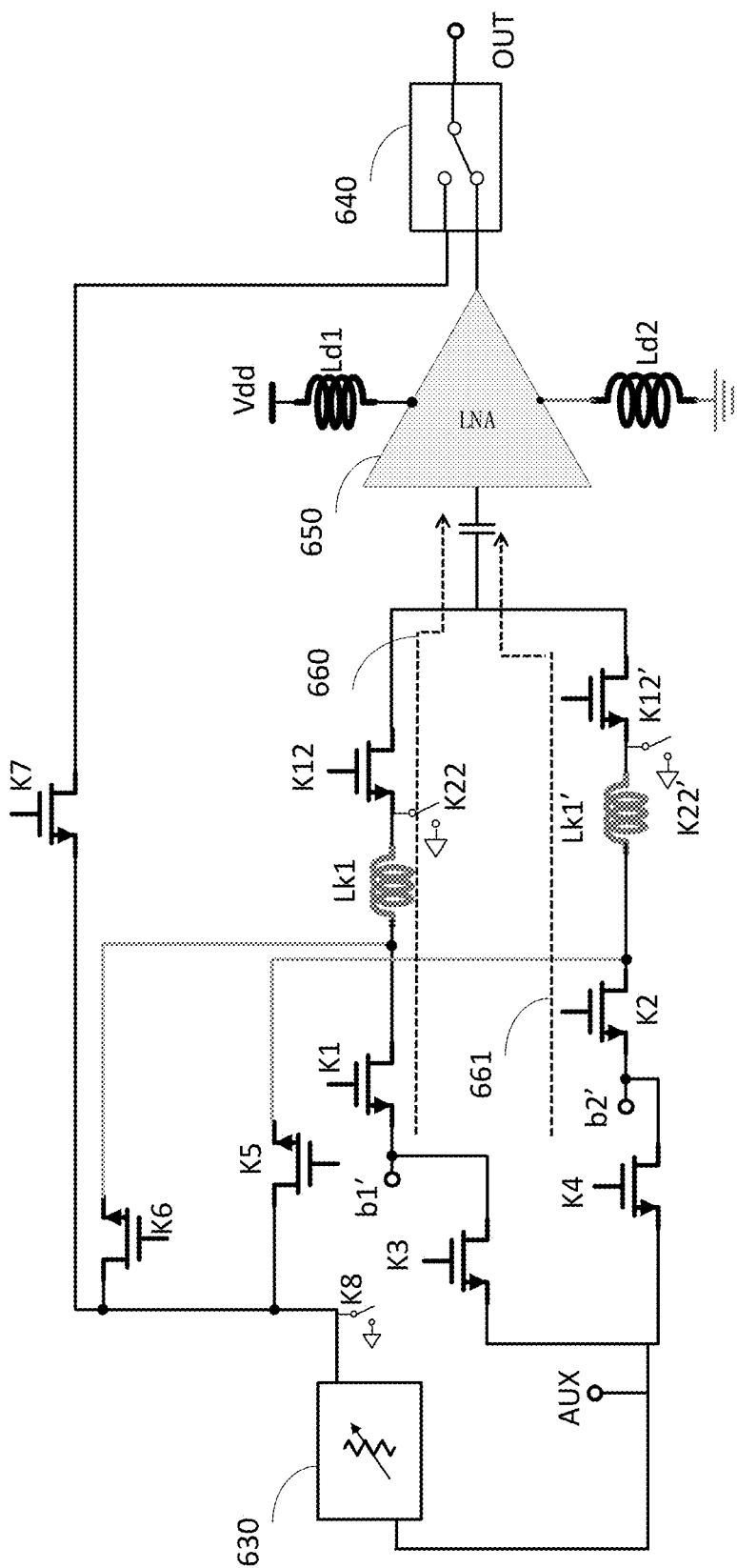
FIGS. 6B-6J show different modes of operations of the RF receiver front end of FIG. 6A.

FIG. 6B shows RF receiver front end (600A) of FIG. 6A where the signal paths in high gain mode for each of the main band frequencies, i.e. the first frequency band and the second frequency band, are shown with dotted lines (660, 661). In other words, in the high gain mode, the signal corresponding to the first frequency band at terminal (b1') will follow the path as shown with dotted line (660), and the signal corresponding to the second frequency band at terminal (b2') will follow the signal path as indicated by dotted line (661). As an example, in this mode, and if the first frequency band is selected, switches (K1, K12) are ON (closed) and switch (K22) is OFF (open). In addition, switches (K2, K12') are OFF (open) and switch (K22') is ON (closed) for increased isolation. Continuing with the same example, switches (K3, . . . , K7) are all OFF (open) to decouple any signal leakage to other paths other than the desired path indicated by dotted line (660, 661). Switch (K8) on the other hand may be ON (closed) to provide further isolation. Switch (640) is in bottom position to convey the amplified signal at the output of LNA (650) to output terminal (OUT).

Figure 6C:
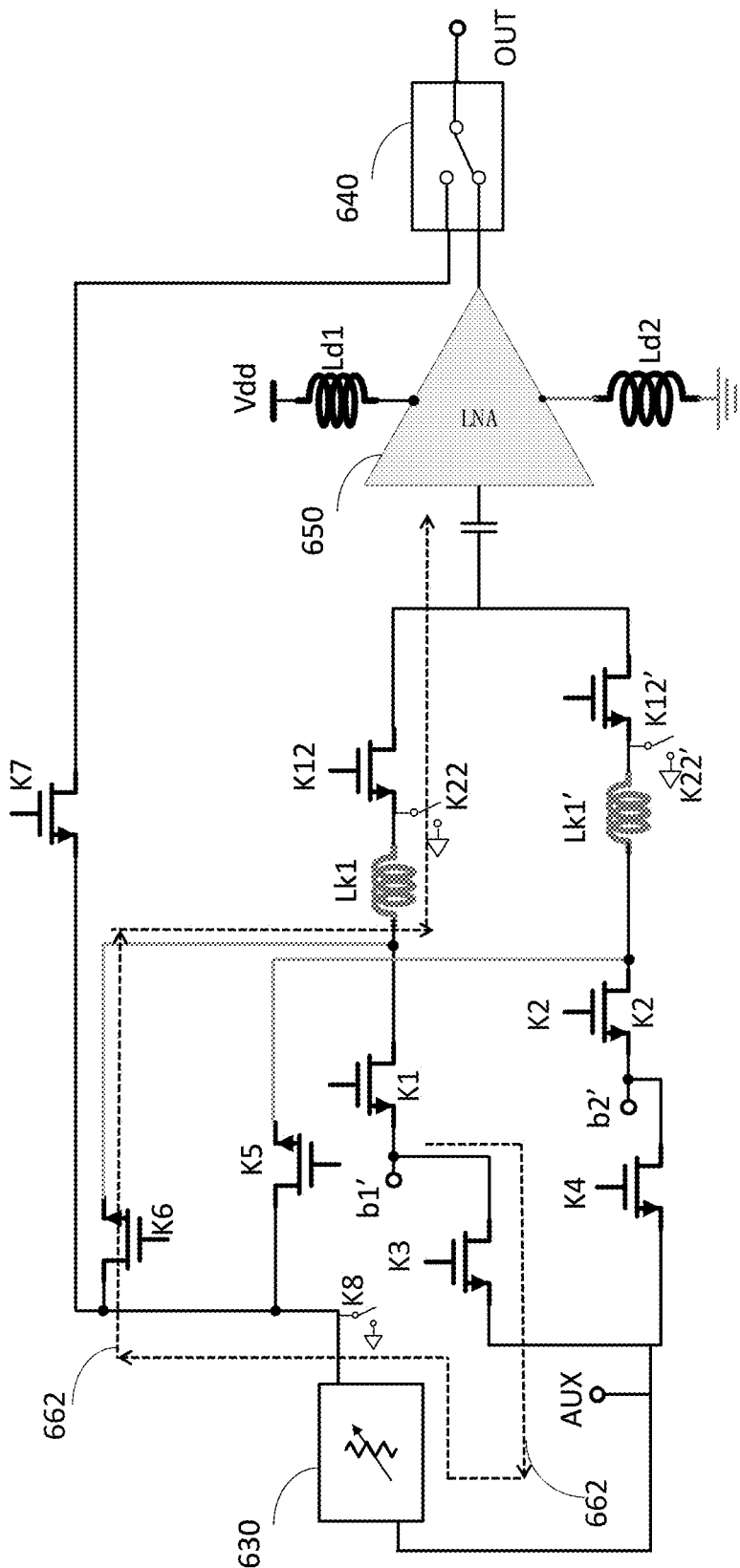

FIG. 6C shows a first instance of RF receiver front end (600A) of FIG. 6A operating in low gain mode. As an example, the signal path in the case where the first band frequency is selected is shown by dotted line (662). Switches (K3, K6, K12) are ON (closed) to pass the input signal from terminal (b1') to the input of LNA (650). Switches (K22, K8) are OFF (open) and switches (K1, K2, K4, K5, K7, K12') are OFF (open) and switch K22' is ON (closed) to decouple the signal from any possible path other than the one shown with dotted line (662). Switch (640) is in bottom position to convey the amplified signal at the output of LNA (650) to output terminal (OUT).

Figure 6D:
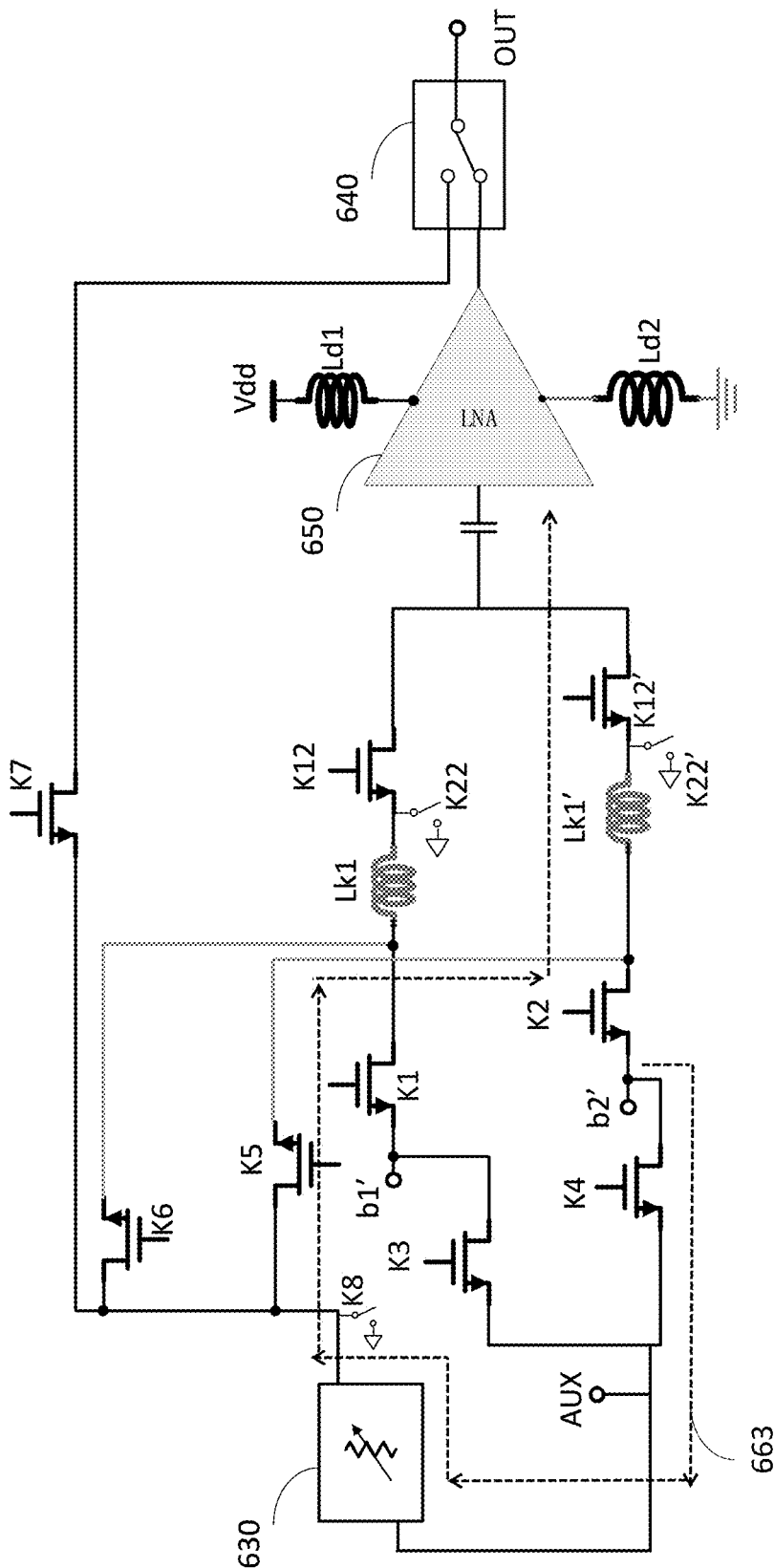

FIG. 6D shows a second instance of RF receiver front end (600A) of FIG. 6A operating in low gain mode. As a further example, the signal path in the case where the second band frequency is selected is shown by dotted line (663). Switches (K4, K5, K12') are ON (closed) to convey the input signal from terminal (b2') to the input of LNA (650). Switches (K22', K8) are OFF (open) and switches (K1, K2, K3, K7, K12) are OFF (open) and switch K22 is ON (closed) to decouple the signal from any possible path other than the one shown with dotted line (663). Switch (640) is in bottom position to convey the amplified signal at the output of LNA (650) to output terminal (OUT).

Figure 6E:
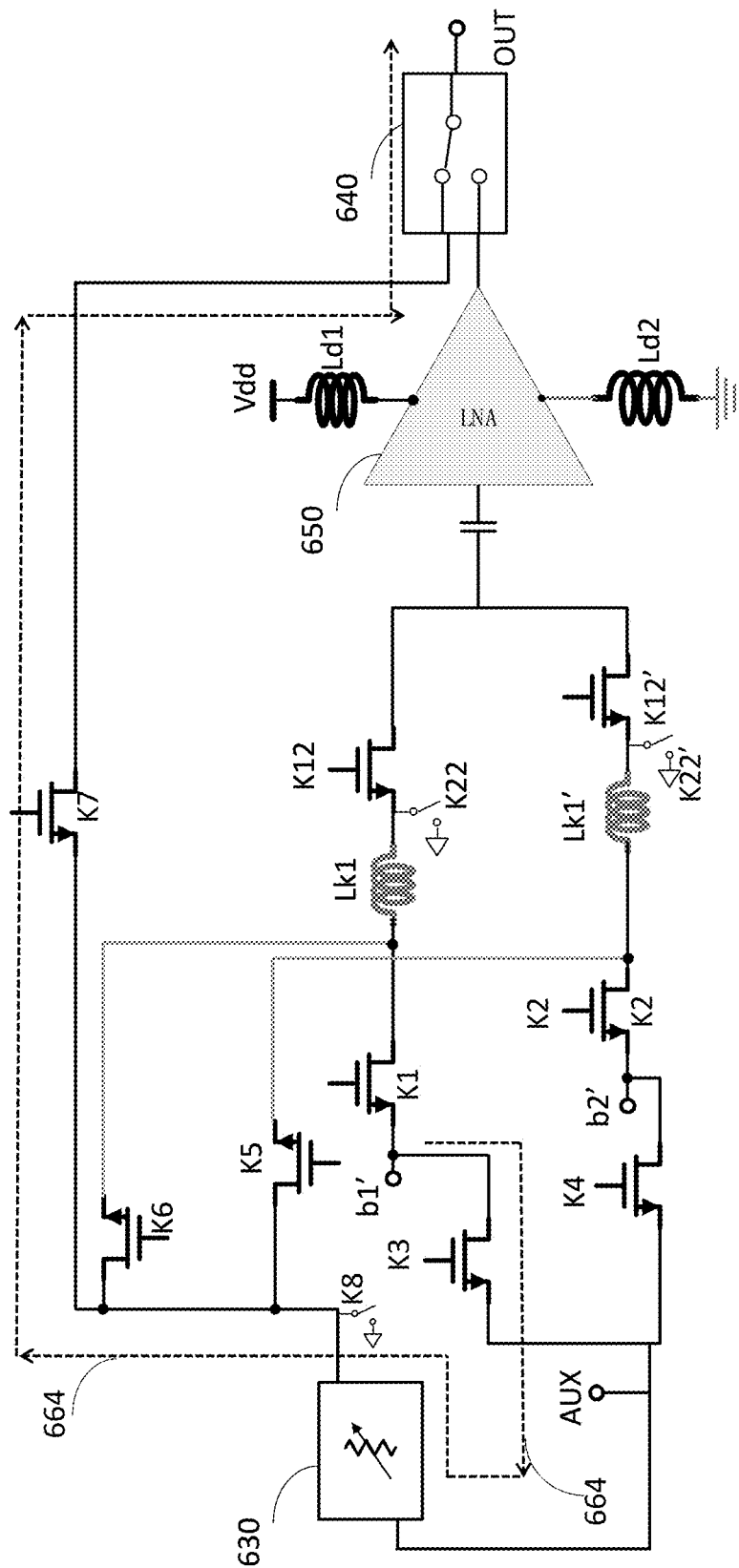

FIG. 6E shows a first instance of RF receiver front end (600A) of FIG. 6A operating in bypass mode. As an example, the signal path in the case where the first band frequency is selected is shown by dotted line (664). Switches (K3, K7) are ON (closed) to pass the input signal at terminal (b1') to output terminal (OUT) via switch (K7). Switch (K8) is OFF (open) and switches (K1, K2, K4, K5, K6, K12', K12) are OFF (open) to decouple from any possible path other than the one shown with dotted line (664). Switch (640) is in top position to convey the signal originating at terminal (b1') to output terminal (OUT) through switch (K7). Switches (K22, K22') are ON (closed) for further isolation.

Figure 6F:
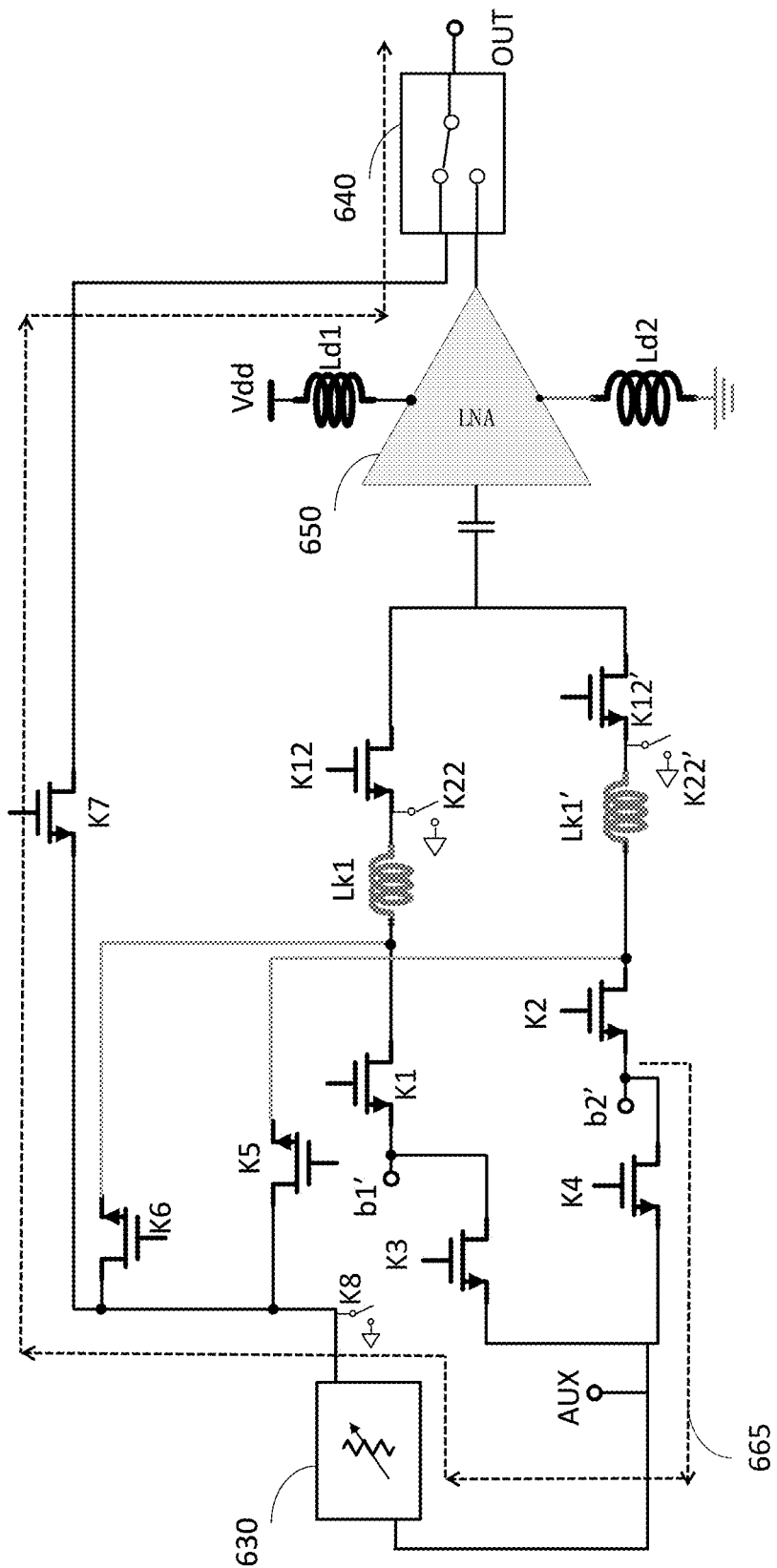

FIG. 6F shows a second instance of RF receiver front end (600A) of FIG. 6A operating in bypass mode. As a further example, the signal path in the case where the second band frequency is selected is shown by dotted line (665). Switches (K4, K7) are ON (closed) to convey the input signal from terminal (b2') to output terminal (OUT). Switch (K8) is OFF (open) and switches (K1, K2, K3, K5, K6, K12, K12') are OFF (open) to decouple the signal from any possible path other than the one shown with dotted line (665). Switch (640) is in top position to transfer the signal originating at terminal (b2') to output terminal (OUT) through switch (K7). Switches (K22, K22') are ON (closed) for further isolation.

Figure 6G:
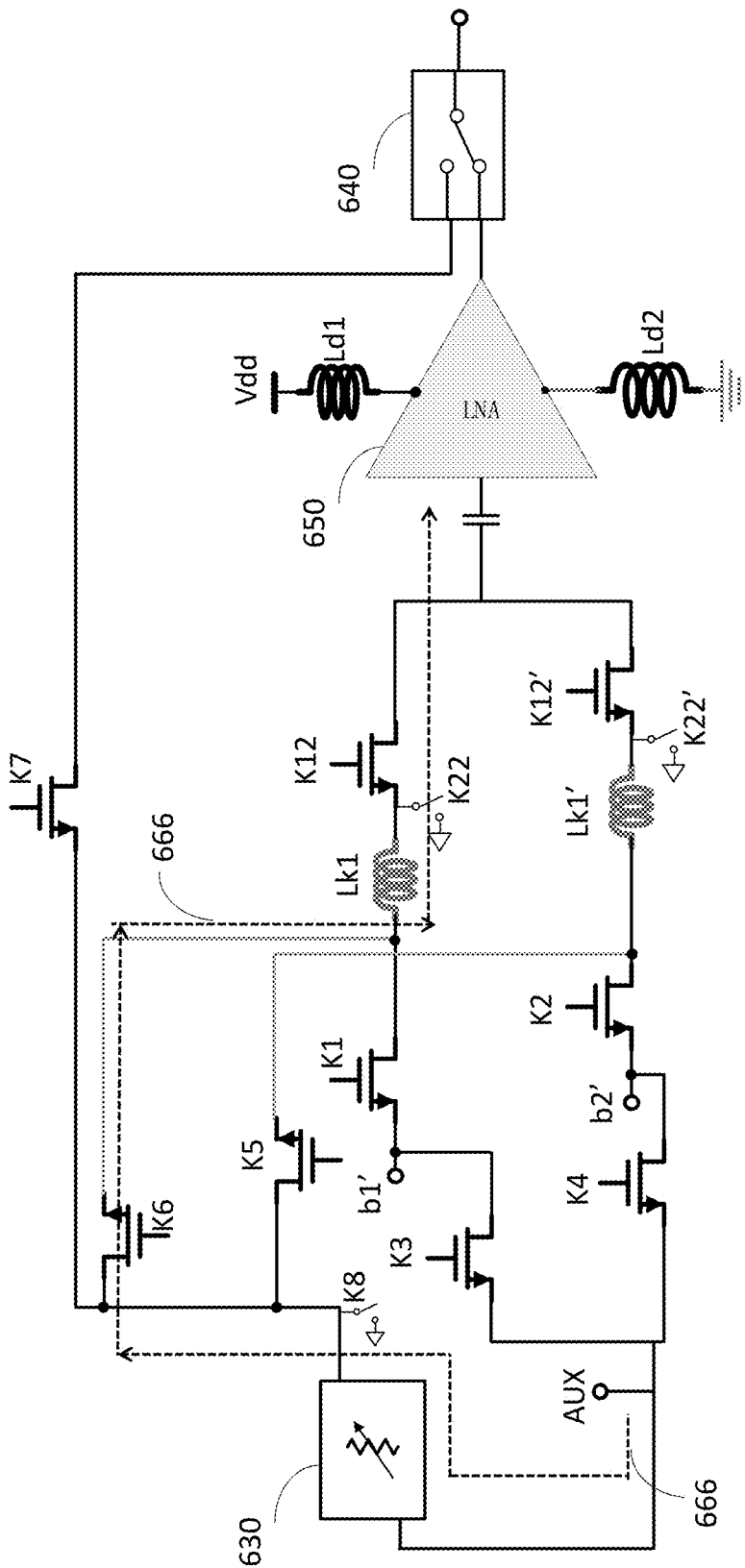

FIG. 6G shows RF receiver front end (600A) of FIG. 6A in an operative condition where the AUX terminal is being used. The signal path in the scenario where the first frequency band (or frequency band near the first frequency band) is selected is shown by dotted line (666). In this exemplary case, the first frequency band is covered by the AUX terminal. Switches (K6, K12) are ON (closed) to convey the input signal from the AUX terminal to the input of LNA (650). Switches (K8, K22) are OFF (open) and switches (K1, K2, K3, K4, K5, K7, K12') are OFF (open) to decouple the input signal from any possible unwanted path other than the one shown with dotted line (666). Switch (640) is in bottom position to convey the amplified signal at the output of LNA (650) to output terminal (OUT). Switch (K22') is ON (closed) for further isolation of the path for the unselected second frequency band. Attenuator (630) may be bypassed in the high gain mode and adjusted to a desired value for the low gain mode.

Figure 6H:
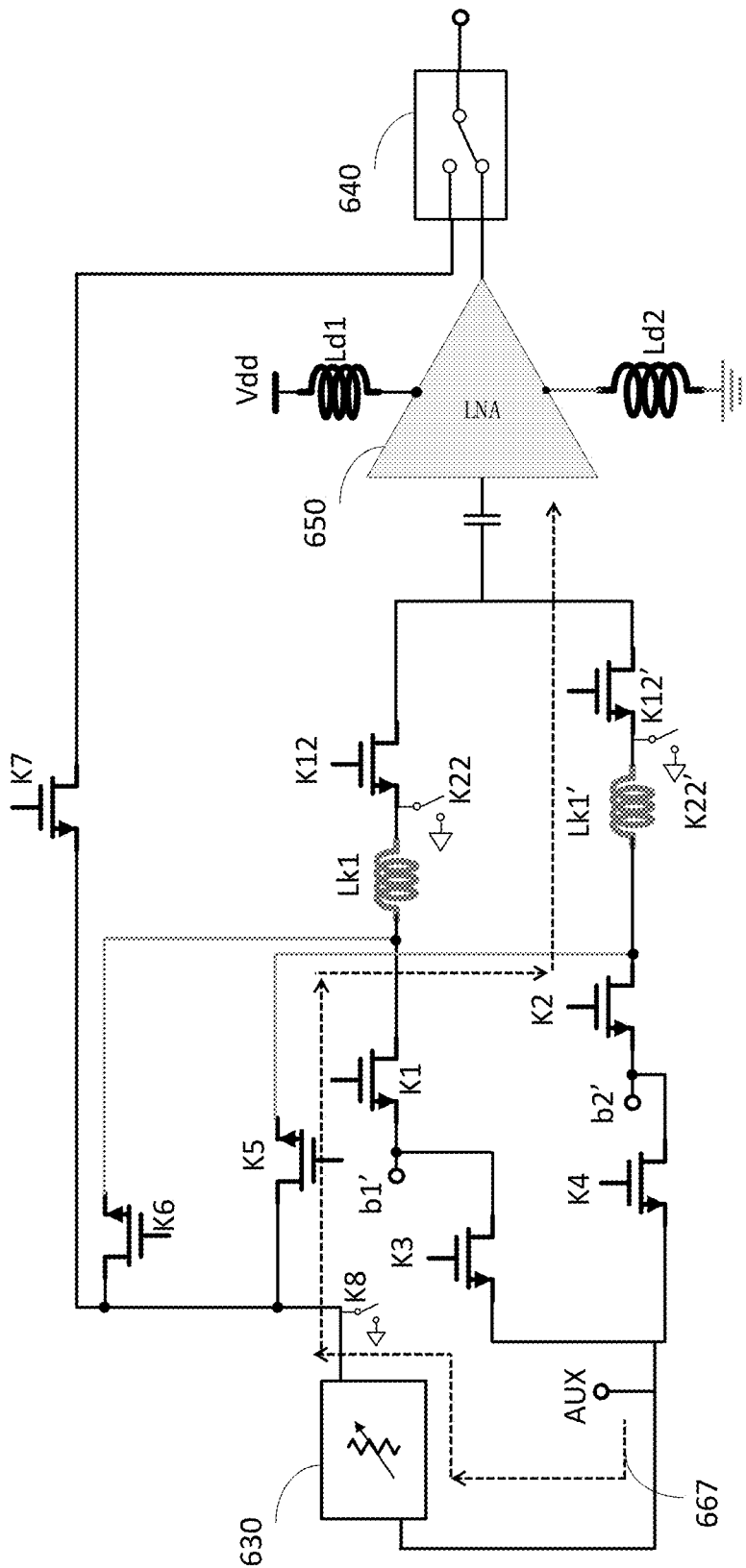

FIG. 6H shows RF receiver front end (600A) of FIG. 6A in an exemplary operative condition where the AUX terminal covering the second frequency band (or frequency band near the second frequency band) is being used. The signal path is shown with dotted line (667). Switches (K5, K12') are ON (closed) to convey the input signal from the AUX terminal to the input of LNA (650). Switches (K8, K22') are OFF (open) and switches (K1, K2, K3, K4, K6, K7, K12) are OFF (open) to decouple the input signal from any possible unwanted path other than the one shown with dotted line (667). Switch (640) is in bottom position to pass the amplified signal at the output of LNA (650) to output terminal (OUT). The overall gain may be adjusted through attenuator (630). Switch (K22) is ON (closed) for further isolation of the path for the unselected first frequency band. Attenuator (630) may be bypassed in the high gain mode and adjusted to a desired value for the low gain mode.

Figure 6I:
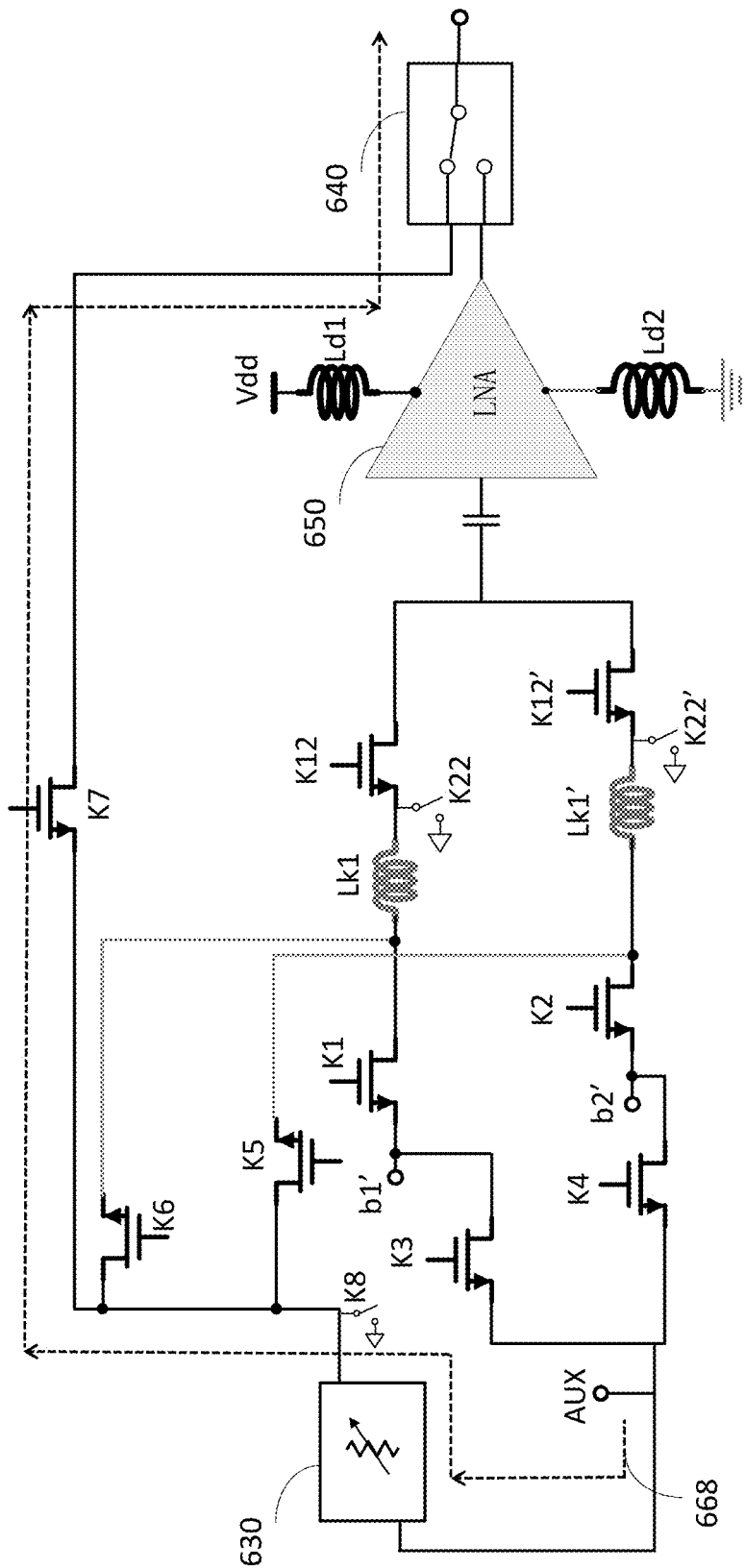

FIG. 6I shows RF receiver front end (600A) of FIG. 6A in an exemplary operative condition where the AUX terminal is being used in the bypass mode. The bypass signal path is shown by dotted line (668). Switch (K7) is ON (closed) to pass the input signal from the AUX terminal to output terminal (OUT). Switch (K8) is OFF (open) and switches (K1, . . . , K6, K12, K12') are OFF (open) to decouple the signal from any possible path other than the one shown with dotted line (668). Switch (640) is in top position to transfer the signal originating at the AUX terminal to output terminal (OUT) through switch (K7). Switches (K22, K22') are ON (closed) to provide additional isolation. Attenuator (630) may be bypassed in the bypass mode.

Figure 6J:
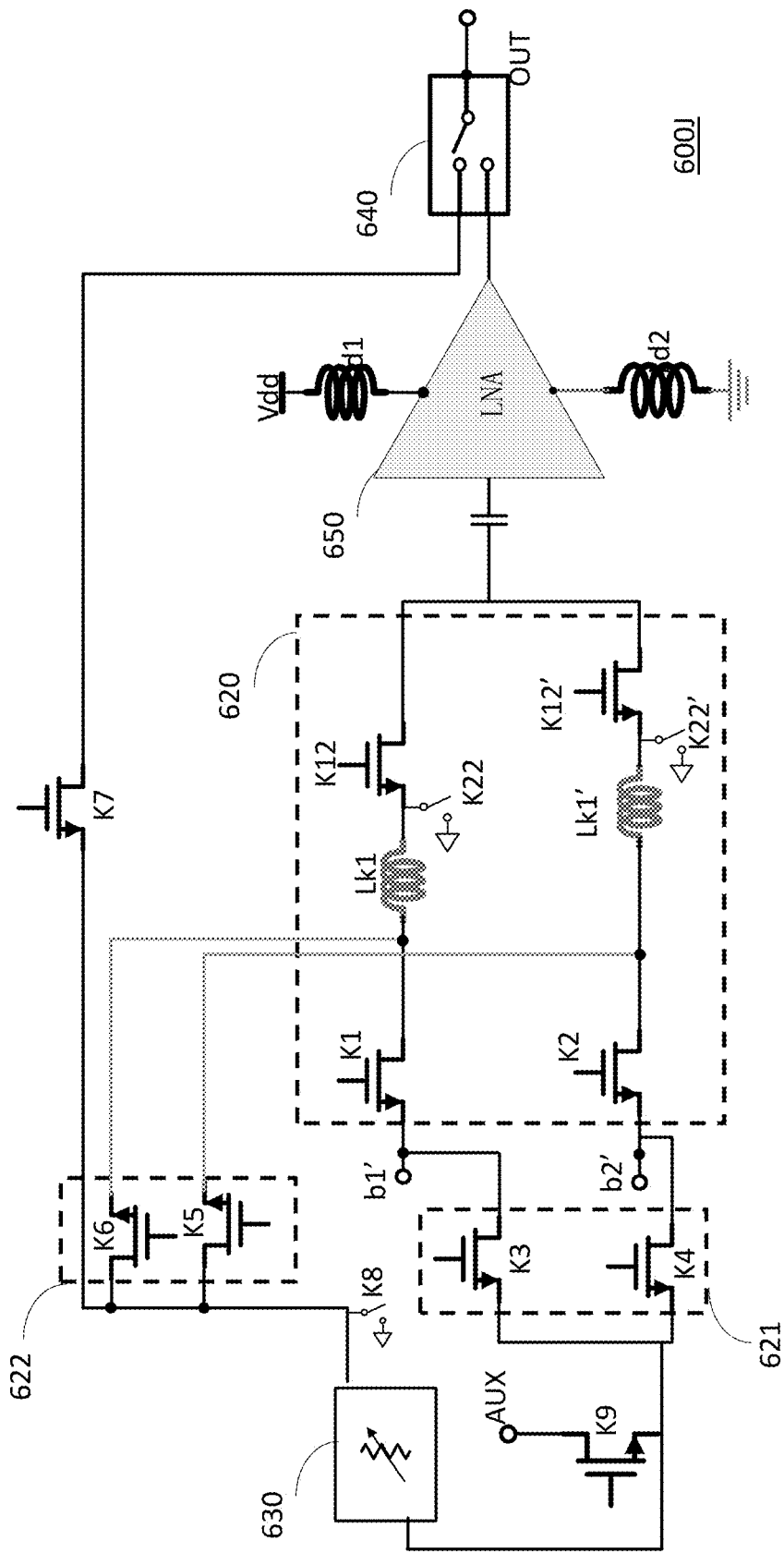

FIG. 6J shows an RF receiver front end (600J) in accordance with further embodiments of the present disclosure. The principle of operation of RF receiver front end receiver (600J) is similar to what was described with regards to embodiments of FIGS. 6A-6I except that receiver front end (600J) of FIG. 6J further comprises switch (K9) at the AUX terminal. Switch (K9) is essentially implemented for improved isolation, or to decouple any impedance seen from AUX terminal, when operating in main frequency band and low gain mode).

Figure 7:
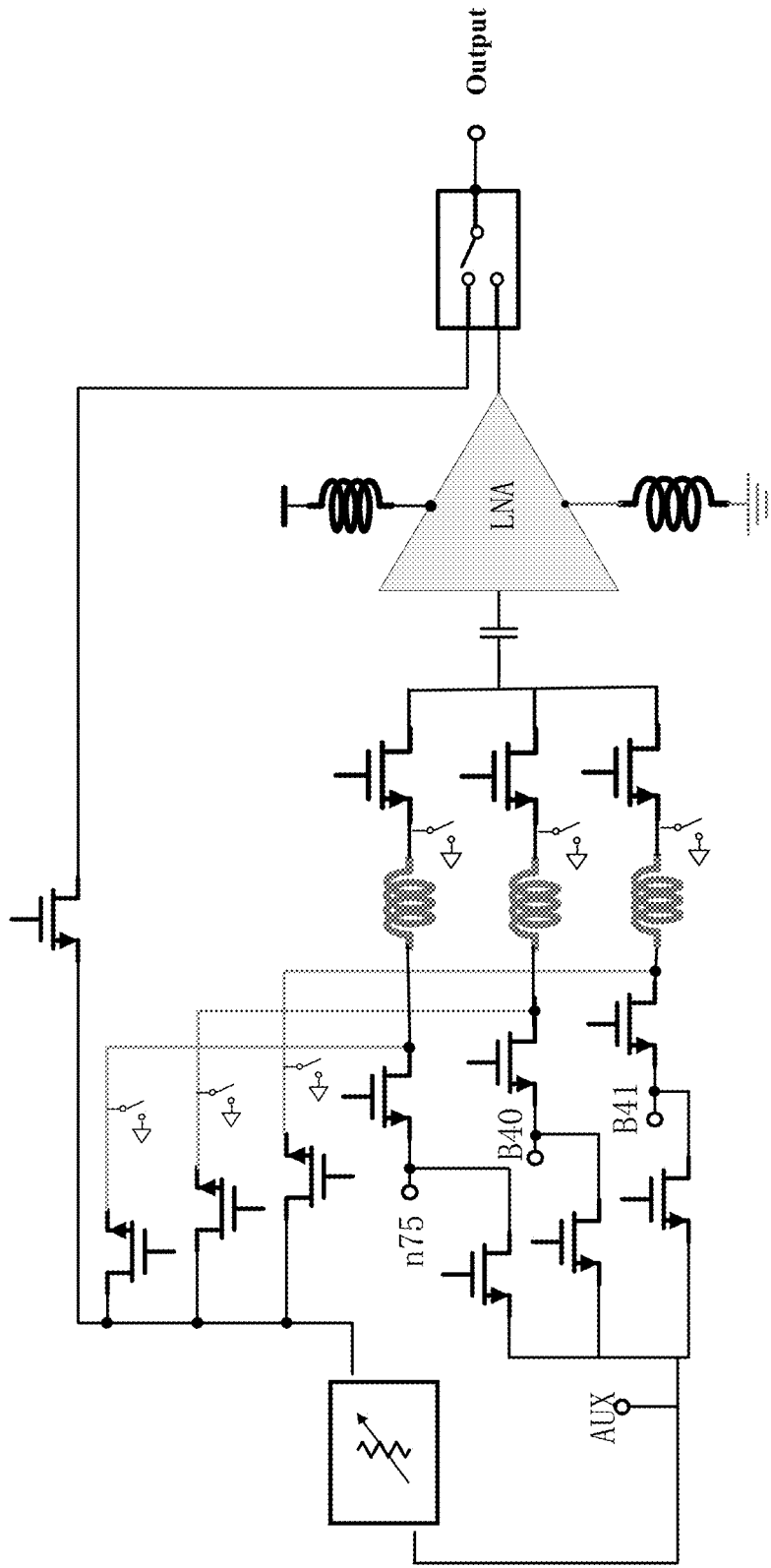
FIG. 7 shows an exemplary RF receiver front end according to an embodiment of the present disclosure.

It is understood that the embodiments shown in FIGS. 6A-6J represent exemplary RF receiver front ends including an AUX terminal and accommodating two separate frequency bands. The person skilled in the art will understand that RF front end receivers following the concepts disclosed above, and covering an arbitrary number of bands may also be envisaged. As an example, FIG. 7 shows RF receiver front end (700) in accordance with another embodiment of the present disclosure and accommodating three different frequency bands (e.g. n75, B40, B41).

With further reference to FIGS. 6G-6I, in accordance with the embodiments of the present disclosure, attenuator (630) may be tunable or may comprise one or more attenuation elements that are selectively switchable. Control circuits (not shown) may be implemented to control the statuses of various switches shown in FIGS. 6A-6I. Embodiments may also be envisaged where attenuator (630) is bypassed, for example, in the bypass mode. In some embodiments, LNA block (650) may include tuning components to facilitate gain and band tuning.

With reference to FIGS. 6A-6J, the person skilled in the art will appreciate that, by virtue of including attenuator (630), multiple gain modes can be achieved. Moreover, this will also provide a better ability to meet the often challenging requirements related to Input Third Order Intercept Point (IIP3).

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

As should be readily apparent to one of ordinary skill in the art, various embodiments of the invention can be implemented to meet a wide variety of specifications. Unless otherwise noted above, selection of suitable stack values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 100 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Stack voltage, current, and power handling capabilities may be adapted as needed, for example, by adjusting device sizes, serially "stacking" stacks (particularly FETs) to withstand greater voltages, and/or using multiple stacks in parallel to handle greater currents. Additional circuit stacks may be added to enhance the capabilities of the disclosed circuits and/or to provide additional functional without significantly altering the functionality of the disclosed circuits.

The invention claimed is:

1. A multiband radio frequency (RF) receiver front end comprising:
   a plurality of amplifying transistors;
   a switching block comprising a plurality of switching arrangements, each switching arrangement being in correspondence with a selectable frequency band of a plurality of selectable frequency bands and with an amplifying transistor of the plurality of amplifying transistors;
   one or more impedance matching inductors, each impedance matching inductor coupling a respective switching arrangement to a respective amplifying transistor, each being matched to a respective selectable RF band, and
   an auxiliary (AUX) terminal configured to receive a wideband input signal, the AUX terminal being connected to the plurality of amplifying transistors via the switching block.

2. The multiband RF receiver front end of claim 1, wherein the each switching arrangement comprises:
   a series switch configured to selectively couple the wideband input signal at the AUX terminal to the amplifying transistor of the plurality of transistors.

3. The multiband RF receiver front end of claim 2, wherein the each switching arrangement further comprises:
   a shunt switch configured to selectively couple the AUX terminal to a reference voltage when the switching arrangement is not selected, to isolate the wideband input signal from the plurality of amplifying transistors.

4. The multiband RF receiver front end of claim 3, wherein:

a) when the selectable frequency band is selected:
   a1) the series switch is in ON state to couple the input signal to the impedance matching inductor, and
   a2) the shunt switch is in OFF state to decouple the input signal from the reference voltage, and
b) when the frequency band is not selected
   b1) the series switch is in OFF state to decouple the input signal from the plurality of amplifying transistors, and
   b2) the shunt switch is in ON state, to further isolate the input signal from the plurality of amplifying transistors.

5. The multiband RF receiver front end of claim 1, further comprising:
   a plurality of main input terminals, each main input terminal corresponding to the selectable frequency band of the plurality of selectable frequency bands and configured to receive a corresponding main input terminal signal;
   a plurality of matching filters, each matching filter corresponding to the selectable frequency band and coupling the main input terminal signal to the corresponding amplifying transistor via the corresponding impedance matching inductor.

6. The multiband RF receiver front end of claim 5 having a first state where the AUX terminal is in use and a second state where the AUX terminal is not in use, the multiband RF receiver front end further comprising a plurality of impedance matching blocks, each impedance matching block being coupled at an output of the matching filter and configured to selectively impedance match the output of the matching filter to a rest of the multiband RF receiver in the first state and in the second state.

7. The multiband RF receiver front end of claim 6, wherein the impedance matching block comprises a first impedance matching inductor and a second impedance matching inductor, and wherein:
   in the first state, the first impedance matching inductor selectively couples the output of the matching filter to a reference voltage, and
   in the second state, the second impedance matching inductor selectively couples the output of the matching filter to the reference voltage.

8. The multiband RF receiver front end of claim 7, wherein the impedance matching block further comprises a first impedance matching switch in series with the first impedance matching inductor, and a second impedance matching switch in series with the second impedance matching inductor, and wherein:
   in the first state, the first impedance matching switch is in ON state, and the second impedance matching switch is in OFF state, and
   in the second state, the first impedance matching switch is in OFF state, and the second impedance matching switch is in ON state.

9. The multiband RF receiver front end of claim 8 further comprising a control circuit to control states of the plurality of switching arrangements, the first impedance matching switch and the second impedance matching switch.

10. The multiband RF receiver front end of claim 1, further comprising at least one cascode transistor coupling the plurality of the amplifying transistors to an output of the multiband RF receiver front end.

11. The multiband RF receiver front end of claim 10, further comprising a degenerative inductor configured to couple the plurality of amplifying transistors to a reference voltage and an output inductor configured to couple the at least cone cascode transistor to a power supply.

12. A multiband radio frequency (RF) receiver front end comprising:
   a low noise amplifier (LNA) having with an LNA input and an LNA output;
   an RF receiver output terminal;
   a plurality of main input terminals in correspondence with a plurality of selectable frequency bands; each main input terminal configured to receive a corresponding main input signal of a plurality of main input signals;
   an auxiliary (AUX) terminal being configured to receive a wideband input signal;
   a first switching arrangement coupled between the LNA input and the plurality of main input terminals;
   a second switching arrangement coupled between the AUX terminal and the first switching arrangement;
   a third switching arrangement coupled to the first switching arrangement, and
   an attenuator coupling the AUX terminal and the second switching arrangement to the third switching arrangement;
   wherein, in a first state:
      the first switching arrangement is configured to decouple the plurality of main input terminals from the LNA input;
      the second switching arrangement is configured to decouple the plurality of main input terminals from the AUX terminal;
      based on a selected band of the plurality of selectable frequency band, a combination of the first switching arrangement and the third switching arrangement is configured to convey the wideband signal from the AUX terminal, through the attenuator, to the LNA input.

13. The RF receiver front end of claim 12, wherein the attenuator is an adjustable attenuator to adjust a gain of the RF receiver front end.

14. The RF receiver front end of claim 13, wherein in a second state:
   the second switching arrangement is configured to decouple the AUX terminal from the plurality of main input terminals;
   the third switching arrangement is configured to decouple the attenuator and the AUX terminal from the first switching arrangement;
   the first switching arrangement is configured to convey a main input signal corresponding to the selected frequency band of the plurality of selectable frequency bands to the LNA input, and to decouple all the main input terminals in correspondence with non-selected frequency bands from the LNA input.

15. The RF receiver front end of claim 14, wherein in a third state:
   based on the selected frequency band of the plurality of selectable frequency bands, a combination of the first, the second and the third switching arrangements is configured to:
      convey, through the attenuator, the main input signal corresponding to the selected frequency band to the LNA input, and
      decouple all the main input terminals in correspondence with non-selected frequency bands of the plurality of selectable frequency bands from the LNA input.

16. The RF receiver front end of claim 15, wherein the first switching arrangement comprises a plurality of branches in correspondence with the plurality of selectable frequency bands, each branch being connected to the main input terminal at one end and to the LNA input at another end, the each branch comprising:
   a first series switch;
   a second series switch; and
   a matching inductor coupled between the first series switch and the second series switch,
   wherein the matching inductor matches the selectable frequency band corresponding to the main input terminal connected to the branch.

17. The RF receiver front end of claim 16, wherein in the first and the third state:
   the first series switch of the branch corresponding to the selected frequency band is on ON state;
   the second series switch of the branch corresponding to the selected frequency band is in OFF state; and
   all first and second series switches of the branches corresponding to non-selected frequency bands are in OFF state.

18. The RF receiver front end of claim 17, wherein in the second state:
   the first and the second series switches of the branch corresponding to the selected frequency band are in ON state; and
   the first and the second series switches of all branches corresponding to un-selected frequency bands are in OFF state.

19. The RF receiver front end of claim 15, wherein the second switching arrangement comprises a plurality of branches in correspondence with the plurality of selectable frequency bands, each branch comprising a second switching arrangement series switch.

20. The RF receiver front end of claim 19, wherein in the first and the second state, all second switching arrangement series switches are in OFF state.

21. The RF receiver front end of claim 20, wherein the third state, a second switching arrangement series switch in the branch in correspondence with selected frequency band is in ON state, and wherein all second switching arrangement series switches in branches in correspondence with non-selected frequency bands are in OFF state.

22. The RF receiver front end of claim 15, wherein the third switching arrangement comprises a plurality of branches in correspondence with the plurality of selectable frequency bands, each branch comprising a third switching arrangement series switch.

23. The RF receiver from end of claim 22, wherein in the first and the third state, a third switching arrangement series switch in the branch corresponding to the selected frequency band is in ON state, and all third switching arrangement series switches in branches in correspondence with non-selected frequency bands are in OFF state.

24. The RF receiver from end of claim 23, wherein the second state, all the third switching arrangement series switches are in OFF state.

25. The RF receiver front end of claim 15, further comprising:
   a bypass output terminal;
   a bypass switch coupled to the attenuator, and
   wherein in a fourth state:
      a combination of the first, the second, and the third switching arrangement is configured to decouple the plurality of main input terminals from the LNA input and the bypass output terminal, the bypass switch is configured to couple the AUX terminal through the attenuator to the bypass output terminal.

26. The RF receiver front end of claim 25, wherein in a fifth state:
   a combination of the first and the third switching arrangements is configured to decouple the plurality of main input terminals from the LNA input;
   based on the selected frequency band of the plurality of selectable frequency bands a combination of the second switching arrangement and the bypass switch is configured to convey, through the attenuator, the main input signal corresponding to the selected frequency band to the bypass output terminal.

27. The RF receiver front end of claim 26, further comprising an output switch configured to selectively couple one of a) the bypass output terminal or b) the output of the LNA to the RF receiver front end output terminal.

28. The RF receiver front end of claim 12, further comprising an AUX isolation switch configured to couple the AUX terminal to a rest of the RF receiver front end when the AUX terminal is in used and to decouple the AUX terminal from the rest of the RF receiver front end when the AUX terminal is not in use.

* * * * *